(12) United States Patent
Kim et al.

(10) Patent No.: US 12,364,146 B2
(45) Date of Patent: Jul. 15, 2025

(54) DISPLAY DEVICE INCLUDING CURVED SIDE SURFACE AND METHOD OF FABRICATING THE SAME

(71) Applicant: Samsung Display Co., LTD., Yongin-si (KR)

(72) Inventors: Jeong Ho Kim, Yongin-si (KR); Konstantin Mishchik, Yongin-si (KR); Hyung Sik Kim, Yongin-si (KR); Kyung Han Yoo, Yongin-si (KR); Seung Hoon Jang, Yongin-si (KR); Se Yeon Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/207,798

(22) Filed: Jun. 9, 2023

(65) Prior Publication Data
US 2024/0081131 A1    Mar. 7, 2024

(30) Foreign Application Priority Data

Sep. 5, 2022 (KR) .................. 10-2022-0112145
Sep. 28, 2022 (KR) .................. 10-2022-0123638

(51) Int. Cl.
*H10K 59/80* (2023.01)
*H10K 71/00* (2023.01)

(52) U.S. Cl.
CPC ....... *H10K 59/8731* (2023.02); *H10K 71/851* (2023.02)

(58) Field of Classification Search
None
See application file for complete search history.

(56) References Cited

U.S. PATENT DOCUMENTS

2013/0344768 A1* 12/2013 Lee .................. H10K 59/871
    445/25
2017/0203994 A1* 7/2017 Chen .................. C03B 33/102
(Continued)

FOREIGN PATENT DOCUMENTS

KR           101120471      3/2012
KR    1020180055734 A   5/2018
(Continued)

OTHER PUBLICATIONS

Korean Office Action—Korean Application No. 10-2022-0123638 dated Sep. 25, 2023.

*Primary Examiner* — Nduka E Ojeh
(74) *Attorney, Agent, or Firm* — CANTOR COLBURN LLP

(57) ABSTRACT

A display device includes a glass substrate including a first surface, a second surface opposite to the first surface, and a side surface between the first and second surfaces, an outermost structure disposed on the first surface and adjacent to an edge of the glass substrate, and a display area including a plurality of emission areas spaced apart from the edge on the first surface of the glass substrate. The side surface has a curved shape with the edge protruding to an outermost side of the glass substrate, the side surface includes a first side surface between the edge and the first surface, and a second side surface between the edge and the second surface and having a different curvature from the first side surface, and the glass substrate includes an edge area on the first surface, adjacent to the edge, and, in which processing traces are left.

22 Claims, 34 Drawing Sheets

(56) References Cited

U.S. PATENT DOCUMENTS

| | | | |
|---|---|---|---|
| 2022/0126416 A1* | 4/2022 | Ono | C03C 19/00 |
| 2023/0037058 A1* | 2/2023 | Paek | H10K 59/50 |
| 2023/0217734 A1* | 7/2023 | Lee | H10K 50/84 |
| | | | 257/72 |
| 2023/0325016 A1* | 10/2023 | Zhang | H10K 59/1201 |
| | | | 345/173 |

FOREIGN PATENT DOCUMENTS

| | | |
|---|---|---|
| KR | 1020220009685 | 1/2022 |
| KR | 1020220016422 | 2/2022 |
| KR | 1020220096888 | 7/2022 |

* cited by examiner

DISPLAY DEVICE INCLUDING CURVED SIDE SURFACE AND METHOD OF FABRICATING THE SAME

This application claims priority to Korean Patent Application No. 10-2022-0112145, filed on Sep. 5, 2022, and Korean Patent Application No. 10-2022-0123638, filed on Sep. 28, 2022, and all the benefits accruing therefrom under 35 U.S.C. § 119, the content of which in their entirety is herein incorporated by reference.

BACKGROUND

1. Field

The disclosure relates to a display device and a method of fabricating the display device.

2. Description of the Related Art

As the information society has developed, the demand for display devices for displaying images has diversified. The display devices have been applied to various electronic devices such as smart phones, digital cameras, notebook computers, navigation systems, and smart televisions. Here, the display devices may be flat panel display devices such as a liquid crystal display ("LCD") device, a field emission display ("FED") device, or an organic light-emitting diode ("OLED") display device. Light-emitting display devices, among such flat panel display devices, include light-emitting elements capable of allowing the pixels of a display device to emit light, and may thus display an image without the need of a backlight unit for providing light to the display panel.

A display device includes a display area, which displays an image, and a periphery area around the display area such as a non-display area surrounding the display area. A width of the non-display area may be reduced to increase the sense of immersion of the display area and the aesthetics of the display device.

The display devices may be obtained by cutting a mother substrate including a plurality of display cells, along the display cells.

The non-display area of the display device may include a first non-display area, in which wiring and circuits for driving the display area of the display device are disposed, and a second non-display area, which corresponds to a margin area for a cutting process during the fabrication of the display device. As there is a limit in reducing the wiring and the circuits in the non-display area, research is conducted to reduce a width of the second non-display area.

SUMMARY

Features of the disclosure provide a display device capable of minimizing the width of a non-display area and a method of fabricating the display device.

Features of the disclosure also provide a display device capable of improving mechanical strength and a method of fabricating the display device.

However, features of the disclosure are not restricted to those set forth herein. The above and other features of the disclosure will become more apparent to one of ordinary skill in the art to which the disclosure pertains by referencing the detailed description of the disclosure given below.

In an embodiment of the disclosure, a display device includes a glass substrate including a first surface, a second surface, which is opposite to the first surface, and a side surface, which is disposed between the first and second surfaces, an outermost structure disposed on the first surface of the glass substrate and adjacent to an edge of the glass substrate, and a display area including a plurality of emission areas, which are spaced apart from the edge, on the first surface of the glass substrate. The side surface has a curved shape with the edge protruding to an outermost side of the glass substrate, the side surface includes a first side surface, which is disposed between the edge and the first surface, and a second side surface, which is between the edge and the second surface and has a different curvature from the first side surface, and the glass substrate includes an edge area, which is on the first surface, adjacent to the edge, and, in which processing traces are left.

In an embodiment, the second side surface may have a radius of a curvature of about 200 micrometers ($\mu$m) to about 300 $\mu$m.

In an embodiment, a length of the first side surface may be less than a length of the second side surface, and the second side surface may have a curvature gentler than a curvature of the first side surface.

In an embodiment, a width by which the second side surface protrudes from an end of the second side surface to the edge may be about 10% to about 20% of an overall thickness of the glass substrate.

In an embodiment, the width by which the second side surface protrudes from the end of the second side surface to the edge may be about 20 $\mu$m to about 40 $\mu$m.

In an embodiment, a diameter of glass pores formed on the first side surface may be less than a diameter of glass pores formed on the second side surface.

In an embodiment, the diameter of the glass pores formed on the first side surface may be about 5 $\mu$m to about 30 $\mu$m, and the diameter of the glass pores formed on the second side surface may be about 30 $\mu$m to about 50 $\mu$m.

In an embodiment, a vertical distance between the second surface and an imaginary plane parallel to the edge may be about 50% to about 60% of an overall thickness of the glass substrate.

In an embodiment, the vertical distance may be about 100 $\mu$m to about 120 $\mu$m.

In an embodiment, a minimum distance between the edge of the glass substrate and the outermost structure may be about 130 $\mu$m or less.

In an embodiment, a width of the edge area may be about 50 $\mu$m or less.

In an embodiment, the display device may further include an encapsulation layer covering the display area and the outermost structure. The encapsulation layer may include a first encapsulation inorganic film, an encapsulation organic film, which is disposed on the first encapsulation inorganic film, and a second encapsulation inorganic film, which is disposed on the encapsulation organic film, and the first and second encapsulation inorganic films may cover the outermost structure.

In an embodiment of the disclosure, a method of fabricating a display device includes preparing a mother substrate and forming a plurality of display cells on a first surface of the mother substrate, defining cutting lines along the plurality of display cells by applying laser light onto a second surface of the mother substrate, which is opposite to the first surface, and separating substrates where the plurality of display cells is formed, by etching the second surface of the mother substrate along the cutting lines. The laser light defines a plurality of laser spots, which are spaced apart from one another between the first and second surfaces of the mother substrate, and the laser spots define a trajectory with curvature in three-dimensional ("3D") space of the mother substrate.

In an embodiment, the trajectory may have a radius of a curvature of about 500 µm.

In an embodiment, a processing area where the laser spots are defined may be formed in the mother substrate along a thickness direction of the mother substrate and accounts for about 95% to about 100% of a thickness of the mother substrate.

In an embodiment, an outermost curvature laser spot, which is a laser spot at an outermost part of the trajectory, may be disposed at a depth corresponding to about 30% of the thickness of the mother substrate, from the second surface.

In an embodiment, the processing area may be in a range of depths of about 450 µm to about 500 µm in the thickness direction, along which the laser spots are formed, and the outermost curvature laser spot may be about 150 µm apart from the second surface.

In an embodiment, an incidence angle between the second surface and an imaginary line connecting four closest laser spots to the second surface may be 70° to 90°, and an emission angle between the first surface and an imaginary line connecting four closest laser spots to the first surface may be 35° to 40°.

In an embodiment, a horizontal distance between the outermost curvature laser spot and a closest laser spot of the four closest laser spots to the second surface may be about 10 µm to about m, and a horizontal distance between the outermost curvature laser spot and a closest laser spot of the four closest laser spots to the first surface may be about 120 µm to about 150 µm.

In an embodiment, the laser light may have a pulse duration of 10 µmicrojoules (µJ) to 500 µJ, and the laser spots may have a length of about 20 µm to about 25 µm in a thickness direction.

According to the aforementioned and other embodiments of the disclosure, unnecessary areas in the outer part of a display panel may be minimized.

The fabrication of a display device includes a laser irradiation process and an etching process and may thus improve manufacturing efficiency.

It should be noted that the effects of the disclosure are not limited to those described above, and other effects of the disclosure will be apparent from the following description.

BRIEF DESCRIPTION OF THE DRAWINGS

The above and other features and features of the disclosure will become more apparent by describing in detail embodiments thereof with reference to the attached drawings, in which.

DETAILED DESCRIPTION

Embodiments of the disclosure will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. A first element discussed below could be termed a second element without departing from the teachings of the invention, for example. Similarly, the second element could also be termed the first element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Embodiments of the disclosure will hereinafter be described with reference to the attached drawings.

Figure 1:
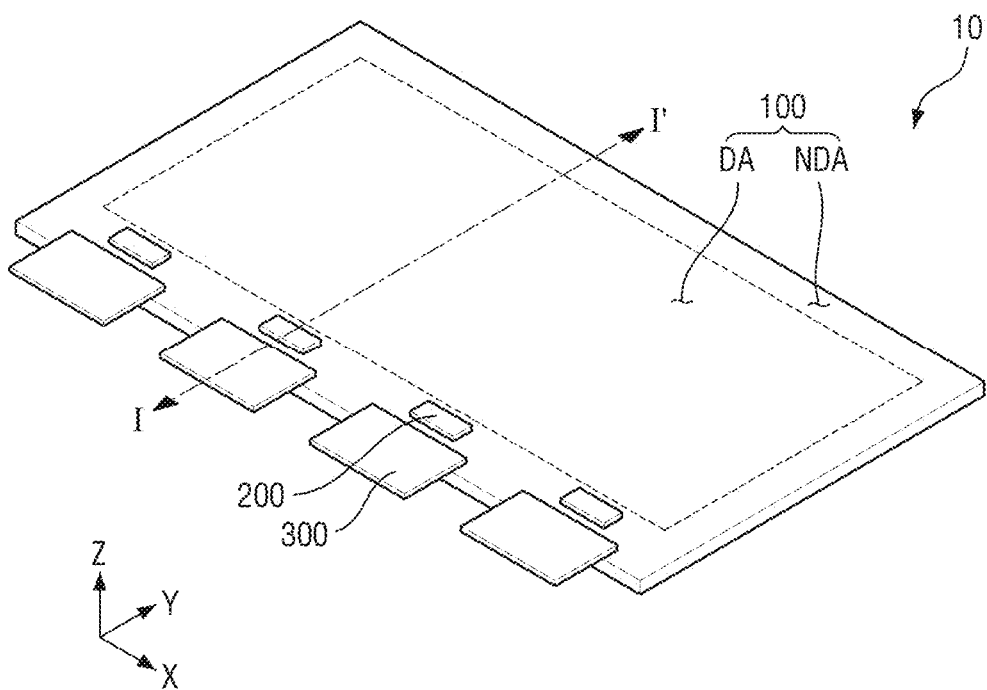
FIG. 1 is a perspective view of an embodiment of a display device according to the disclosure.
Figure 2:
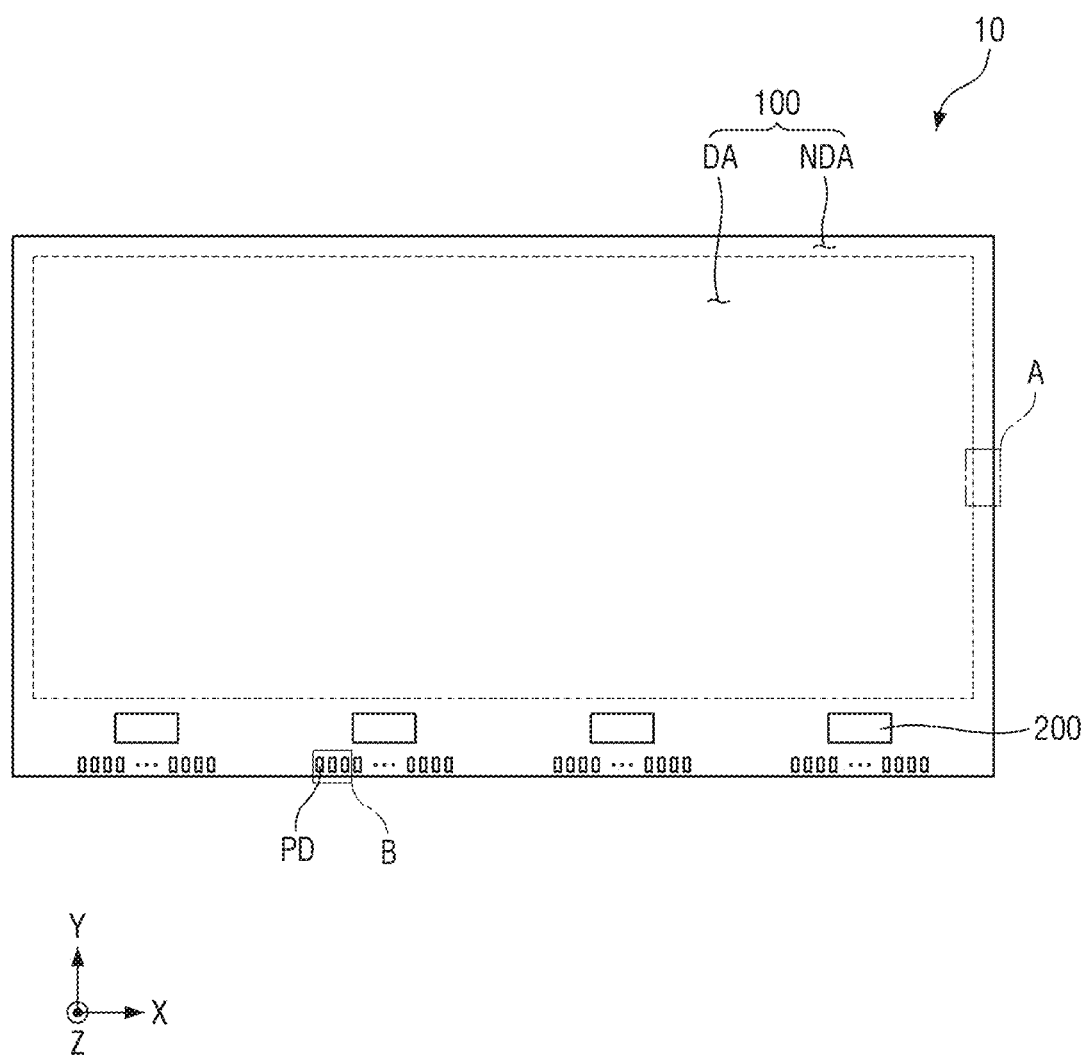
FIG. 2 is a plan view of an embodiment of a display panel according to the disclosure.

FIG. 1 is a perspective view of an embodiment of a display device according to the disclosure. FIG. 2 is a plan view of an embodiment of a display panel according to the disclosure.

Referring to FIGS. 1 and 2, a display device 10, which displays a moving or still image, may be used not only in a portable electronic device such as a mobile phone, a smartphone, a tablet personal computer ("PC"), a smartwatch, a watchphone, a mobile communication terminal, an electronic notepad, an electronic book, a portable multimedia player ("PMP"), a navigation device, or an ultramobile PC ("UMPC"), but also in various other products such as a television ("TV"), a notebook computer, a monitor, a billboard, or an Internet-of-Things ("IoT") device.

The display device 10 may be an organic light-emitting display device using organic light-emitting diodes ("OLEDs"), a quantum-dot light-emitting display device including a quantum-dot light-emitting layer, an inorganic light-emitting display device including an inorganic semiconductor, or an ultrasmall light-emitting diode ("LED") display device using ultrasmall LEDs such as micro-LEDs or nano-LEDs. The display device 10 will hereinafter be described as being an organic light-emitting display device, but the disclosure is not limited thereto.

The display device 10 includes a display panel 100, driver integrated circuits ("ICs") 200, and circuit boards 300.

The display panel 100 may be formed in a quadrangular shape, e.g., rectangular shape having short sides in a first direction (or an X-axis direction) and long sides in a second direction (or a Y-axis direction) in a plan view. The corners where the long sides and the short sides of the display panel 100 meet may be rounded to have a predetermined curvature or may be right-angled. The planar shape of the display panel 100 is not particularly limited, and the display panel 100 may be formed in various other shapes such as another polygonal shape, a circular shape, or an elliptical shape.

The display panel 100 may be flat, but the disclosure is not limited thereto. In one example, the display panel 100 may include curved parts that are disposed at opposite ends of the display panel 100 and have a uniform or varying curvature. The display panel 100 may be flexible such as foldable, bendable, or rollable.

The display panel 100 may include a display area DA, which displays an image, and a non-display area NDA, which is disposed around the display area DA.

The display area DA may define the most area of the display panel 100. The display area DA may be disposed in the middle of the display panel 100. Pixels including emission areas, which display an image, may be disposed in the display area DA.

The non-display area NDA may be disposed adjacent to the display area DA. The non-display area NDA may be an area outside the display area DA. The non-display area NDA may surround the display area DA. The non-display area NDA may be an edge area of the display panel 100.

Display pads PD may be disposed in the non-display area NDA to be connected to the circuit boards 300. The display pads PD may be disposed along one edge of the display panel 100. In an embodiment, the display pads PD may be disposed on the lower edge of the display panel 100, for example.

The display pads PD may be outermost structures disposed on an outermost part of the display panel 100, below the display panel 100. The outermost structures may be structures adjacent to the edge of the display panel 100. The outermost structures may be structures for driving the display panel 100 or improving the functions of the display panel 100.

Figure 6:
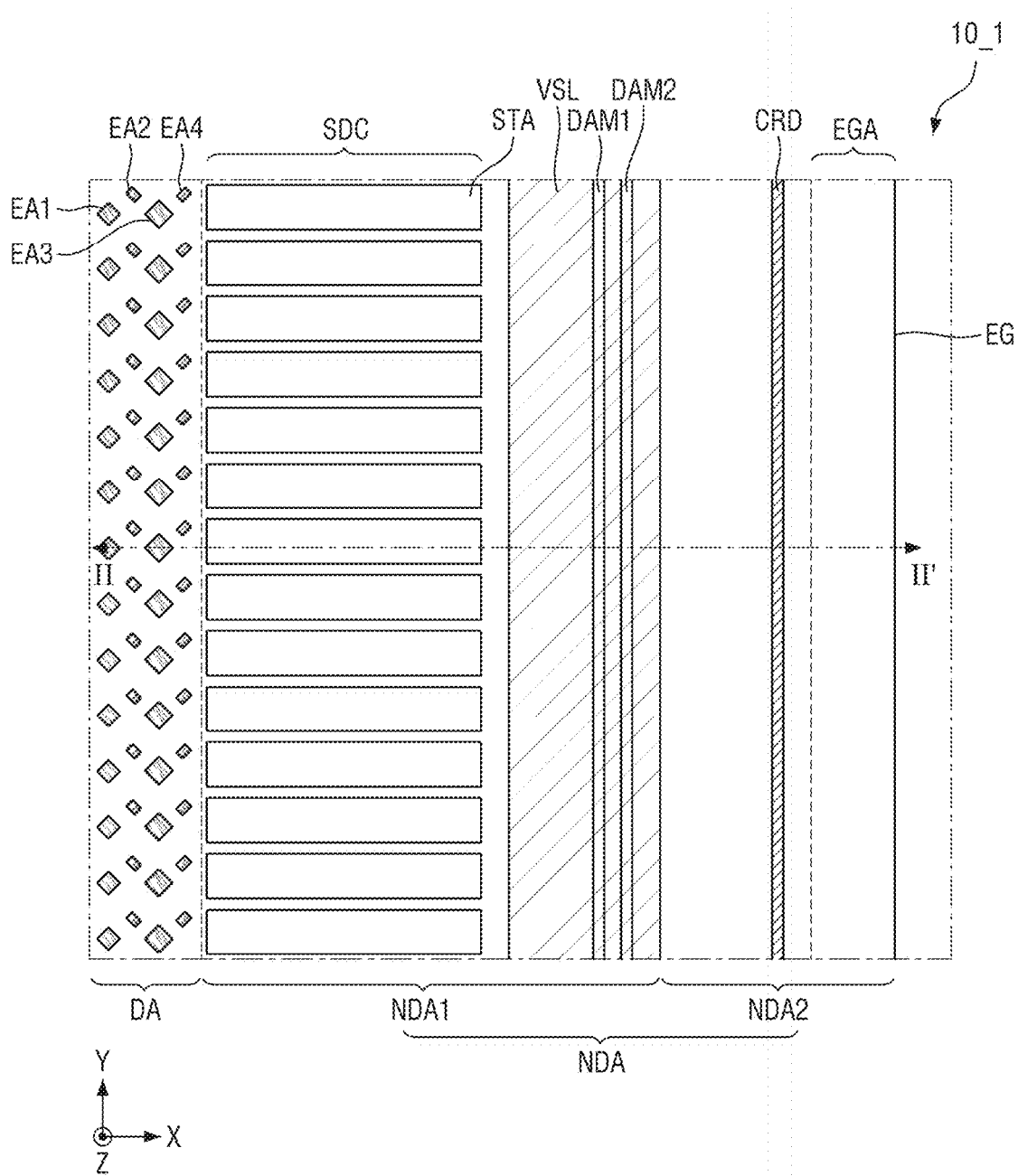
FIG. 6 is a plan view of an area A of FIG. 2.

The display panel 100 may include a first dam DAM1 (refer to FIG. 6), a second dam DAM2 (refer to FIG. 6), and a crack dam CRD (refer to FIG. 6).

Figure 4:
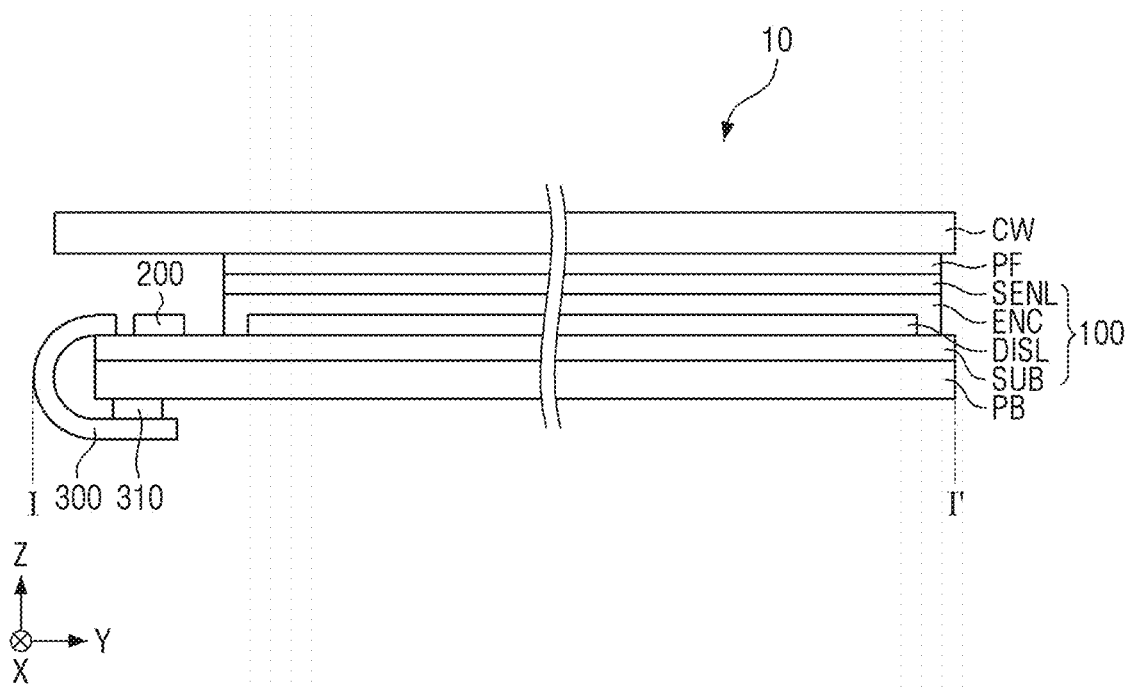
FIG. 4 is a cross-sectional view illustrating the display device of FIG. 3 with its circuit boards curved.

The first and second dams DAM1 and DAM2 may be structures for preventing the overflow of an encapsulation organic film (TFE2 of FIG. 5) of an encapsulation layer (ENC of FIG. 4). The first dam DAM1 may surround the display area DA, and the second dam DAM2 may surround the first dam DAM1.

The crack dam CRD may be a structure for preventing the propagation of cracks in inorganic films of an encapsulation layer ENC during the cutting of a substrate SUB (refer to FIG. 3), as performed during the fabrication of the display device 10. The crack dam CRD may be disposed along the left, upper, and right edges of the display panel 100. The crack dam CRD may not be disposed on the lower edge of the display panel 100. The crack dam CRD may be an outermost structure disposed along the left, upper, and right sides of the display panel 100.

The driver ICs 200 may generate data voltages, power supply voltages, and scan timing signals. The driver ICs 200 may output data voltages, power supply voltages, and scan timing signals.

The driver ICs 200 may be disposed between the display pads PD and the display area DA. The driver ICs 200 may be attached to the non-display area NDA of the display panel 100 in a chip-on-glass ("COG") manner. In an alternative embodiment, the driver ICs 200 may be attached to the non-display area NDA of the display panel 100 in a chip-on-plastic ("COP") manner.

The circuit boards 300 may be disposed on the display pads PD, which are disposed along one edge of the display panel 100. The circuit boards 300 may be attached to the display pads PD via conductive adhesive members such as anisotropic conductive films ("ACFs") or anisotropic conductive adhesives. Accordingly, the circuit boards 300 may be electrically connected to the signal wiring of the display panel 100. The circuit boards 300 may be flexible films such as flexible printed circuit boards ("FPCBs") or chip-on-films ("COFs").

Figure 3:
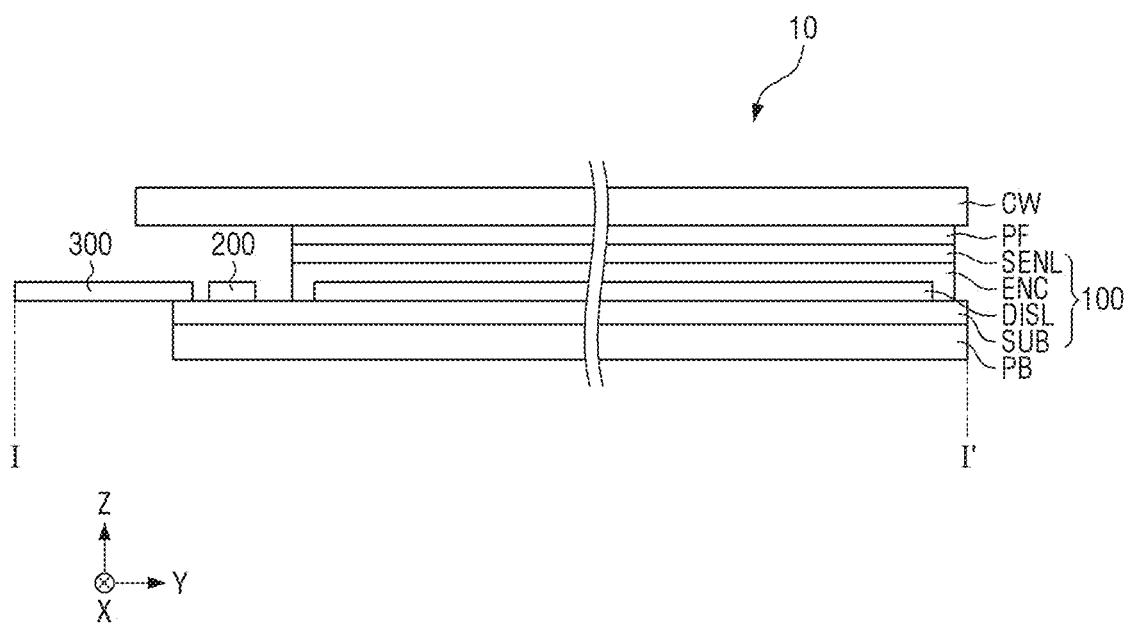
FIG. 3 is a cross-sectional view taken along line I-I' of FIG. 1.

FIG. 3 is a cross-sectional view taken along line I-I' of FIG. 1. FIG. 4 is a cross-sectional view illustrating the display device of FIG. 3 with its circuit boards curved.

Referring to FIGS. 3 and 4, a display device 10 may include a display panel 100, a polarizer film PF, a cover window CW, and a panel bottom cover PB. The display panel 100 may include a substrate SUB, a display layer DISL, an encapsulation layer ENC, and a sensor electrode layer SENL.

The substrate SUB may include or consist of glass.

The display layer DISL may be formed on a first surface of the substrate SUB. The display layer DISL may be a layer displaying an image. The display layer DISL may include a thin-film transistor layer TFTL (refer to FIG. 5), in which thin-film transistors are formed, and a light-emitting element layer EML, in which light-emitting elements are disposed in emission areas.

Scan lines, data lines, and power supply lines for emitting light in the emission areas may be disposed in the display area DA of the display layer DISL. A scan driving circuit unit, which outputs scan signals to the scan lines, and fan-outlines, which connect the data lines and the driver ICs 200, may be disposed in the non-display area NDA.

The encapsulation layer ENC may be a layer encapsulating the light-emitting element layer EML of the display layer DISL to prevent the penetration of oxygen or moisture into the light-emitting element layer EML of the display layer DISL. The encapsulation layer ENC may be disposed on the display layer DISL. The encapsulation layer ENC may be disposed on the upper surface and side surfaces of the display layer DISL. The encapsulation layer ENC may cover the display layer DISL.

The sensor electrode layer SENL may be disposed on the display layer DISL. The sensor electrode layer SENL may include sensor electrodes. The sensor electrode layer SENL may detect touch input from a user by the sensor electrodes.

The polarizer film PF may be disposed on the display panel 100 to reduce the reflection of external light. The polarizer film PF may include a first base member, a linear polarizer plate, a phase retardation film (such as a quarter-wave (λ/4) plate), and a second base member. The first base member, the linear polarizer plate, the phase retardation film, and the second base member may be sequentially disposed on the display panel 100, but the disclosure is not limited thereto. The polarizer film PF may be optional, and the display device 10 may include an antireflection structure, which includes color filters, a low-reflection layer, or the like.

The cover window CW may be disposed on the polarizer film PF. The cover window CW may be attached on the polarizer film PF via a transparent adhesive member such as an optically clear adhesive ("OCA") film.

The panel bottom cover PB may be disposed on a second surface of the substrate SUB of the display panel 100. The second surface of the substrate SUB may be opposite to the first surface of the substrate SUB. The panel bottom cover PB may be attached on the second surface of the substrate SUB of the display panel 100 via an adhesive member. The adhesive member may be a pressure sensitive adhesive ("PSA").

The panel bottom cover PB may include at least one of a light-blocking member, which is for absorbing light incident thereupon from the outside, a buffer member, which is for absorbing shock from the outside, and a heat dissipation member, which is for efficiently releasing heat from the display panel 100.

The light-blocking member may be disposed below the display panel 100. The light-blocking member may block the transmission of light, and may thus prevent components disposed therebelow, such as the display circuit boards 300, from being visible from above the display panel 100. The light-blocking member may include a light-absorbing material such as a black pigment or dye.

The buffer member may be disposed below the light-blocking member. The buffer member may absorb external shock and may thus prevent breakage of the display panel 100. The buffer member may be formed as a single layer or a multilayer. In an embodiment, the buffer member may include or consist of a polymer resin such as polyurethane, polycarbonate, polypropylene, or polyethylene, or an elastic material such as a sponge obtained by foam-molding rubber, a urethane-based material, or an acrylic material.

The heat dissipation member may be disposed below the buffer member. The heat dissipation member may include a first heat dissipation layer, which includes graphite or carbon nanotubes, and a second heat dissipation layer, which includes or consists of a metal capable of blocking electromagnetic waves and having excellent thermal conductivity, such as copper (Cu), nickel (Ni), ferrite, or silver (Ag).

The circuit boards 300 may be bent toward the bottom of the display panel 100, as illustrated in FIG. 4. The circuit boards 300 may be attached on the lower surface of the panel bottom cover PB via adhesive members 310. The adhesive members 310 may be PSAs.

Figure 5:
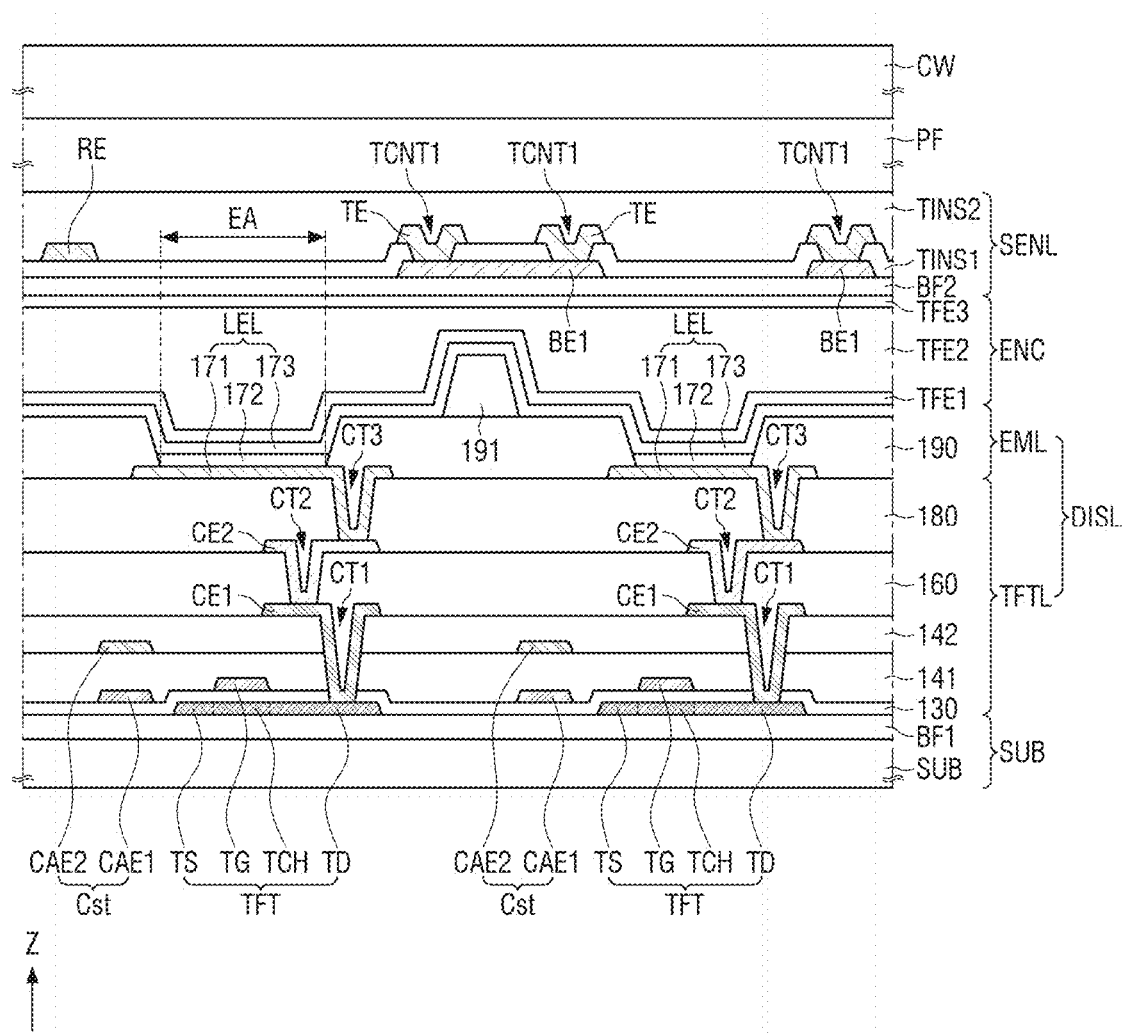
FIG. 5 is a cross-sectional view of a display area of the display panel of FIG. 2.

FIG. 5 is a cross-sectional view of the display area of the display panel of FIG. 2.

Referring to FIG. 5, the display panel 100 may be an organic light-emitting display panel including light-emitting elements LEL, which include organic light-emitting layers 172.

The display layer DISL may include the thin-film transistor layer TFTL, which include thin-film transistors TFT, and the light-emitting element layer EML, which include the light-emitting elements LEL.

A first buffer film BF1 may be disposed on the substrate SUB. The first buffer film BF1 may include or consist of an inorganic material such as silicon nitride, silicon oxynitride, silicon oxide, titanium oxide, or aluminum oxide. In an alternative embodiment, the first buffer film BF1 may be formed as a multilayer film in which more than one layer among a silicon nitride layer, a silicon oxynitride layer, a silicon oxide layer, a titanium oxide layer, and an aluminum oxide layer is alternately stacked.

An active layer, which includes channel regions TCH, source regions TS, and drain regions TD of the thin-film transistors TFT, may be disposed on the first buffer film BF1. The active layer may include or consist of polycrystalline silicon, monocrystalline silicon, substantially low temperature polycrystalline silicon, amorphous silicon, or an oxide semiconductor material. In a case where the active layer includes polycrystalline silicon or an oxide semiconductor material, the source regions TS and the drain regions TD may be conductive regions doped with ions or impurities.

A gate insulating film 130 may be disposed on the active layer. The gate insulating film 130 may be formed as an inorganic film such as a silicon nitride layer, a silicon oxynitride layer, a silicon oxide layer, a titanium oxide layer, or an aluminum oxide layer.

A first gate metal layer, which includes gate electrodes TG of the thin-film transistors TFT, first capacitor electrodes CAE1 of the capacitors Cst, and the scan lines, may be disposed on the gate insulating film 130. The gate electrodes TG of the thin-film transistors TFT may overlap with the channel regions TCH in a third direction (or a Z-axis direction). The first gate metal layer may be formed as a single layer or a multilayer including one of molybdenum (Mo), aluminum (Al), chromium (Cr), gold (Au), titanium (Ti), Ni, neodymium (Nd), Cu, and any alloys thereof.

A first inter-insulating film 141 may be disposed on the first gate metal layer. The first inter-insulating film 141 may be formed as an inorganic film such as a silicon nitride layer, a silicon oxynitride layer, a silicon oxide layer, a titanium oxide layer, or an aluminum oxide layer. The first inter-insulating film 141 may include a plurality of inorganic films.

A second gate metal layer, which includes second capacitor electrodes CAE2 of the capacitors Cst, may be disposed on the first inter-insulating film 141. The second capacitor electrodes CAE2 may overlap with the first capacitor electrodes CAE1 in the third direction (or the Z-axis direction). Thus, the capacitors Cst may be formed by the first capacitor electrodes CAE1, the second capacitor electrodes CAE2, and inorganic insulating dielectric films disposed between the first capacitor electrodes CAE1 and the second capacitor electrodes CAE2. The second gate metal layer may be formed as a single layer or a multilayer including one of Mo, Al, Cr, Au, Ti, Ni, Nd, Cu, and any alloys thereof.

A second inter-insulating film 142 may be disposed on the second gate metal layer. The second inter-insulating film 142 may be formed as an inorganic film such as a silicon nitride layer, a silicon oxynitride layer, a silicon oxide layer, a titanium oxide layer, or an aluminum oxide layer. The second inter-insulating film 142 may include a plurality of inorganic films.

A first data metal layer, which includes first connecting electrodes CE1 and the data lines, may be disposed on the second inter-insulating film 142. The first connecting electrodes CE1 may be connected to the drain regions TD through first contact holes CT1, which penetrate the gate insulating film 130, the first inter-insulating film 141, and the second inter-insulating film 142. The first data metal layer may be formed as a single layer or a multilayer including one of Mo, Al, Cr, Au, Ti, Ni, Nd, Cu, and any alloys thereof.

A first organic film 160 may be disposed on the first connecting electrodes CE1 to planarize step differences formed by the thin-film transistors TFT. The first organic film 160 may be formed as an organic film including an acrylic resin, an epoxy resin, a phenolic resin, a polyamide resin, or a polyimide resin.

A second data metal layer, which includes second connecting electrodes CE2, may be disposed on the first organic film 160. The second data metal layer may be connected to the first connecting electrodes CE1 through second contact holes CT2, which penetrate the first organic film 160. The second data metal layer may be formed as a single layer or a multilayer including one of Mo, Al, Cr, Au, Ti, Ni, Nd, Cu, and any alloys thereof.

A second organic film 180 may be disposed on the second connecting electrodes CE2. The second organic film 180 may be formed as an organic film including an acrylic resin, an epoxy resin, a phenolic resin, a polyamide resin, or a polyimide resin.

The second data metal layer and the second organic film 180 may be optional.

The light-emitting element layer EML is disposed on the thin-film transistor layer TFTL. The light-emitting element layer EML may include the light-emitting elements LEL and a bank 190.

Each of the light-emitting elements LEL may include a pixel electrode 171, a light-emitting layer 172, and a common electrode 173. Emission areas EA refer to areas in which pixel electrodes 171, light-emitting layers 172, and the common electrode 173 are sequentially stacked so that holes from the pixel electrodes 171 and electrons from the common electrode 173 combine together in the light-emitting layers 172 to emit light. In this case, the pixel electrodes 171 may be anodes, and the common electrode 173 may be a cathode.

A pixel electrode layer, which includes the pixel electrodes 171, may be formed on the second organic film 180. The pixel electrodes 171 may be connected to the second connecting electrodes CE2 through third contact holes CT3, which penetrate the second organic film 180. The pixel electrode layer may be formed as a single layer or a multilayer including one of Mo, Al, Cr, Au, Ti, Ni, Nd, Cu, and any alloys thereof.

In a top emission structure where light is emitted in a direction from the light-emitting layers 172 to the common electrode 173, the pixel electrodes 171 may be formed as single layers including Mo, Ti, Cu, or Al or as stacks of Al and indium tin oxide ("ITO") (e.g., ITO/Al/ITO), stacks of a silver (Ag)-palladium (Pd)-copper (Cu) ("APC") alloy, or stacks of an APC alloy and ITO (e.g., ITO/APC/ITO).

The bank 190 defines the emission areas EA. To this end, the bank 190 may expose parts of the pixel electrodes 171, on the second organic film 180. The bank 190 may cover the edges of each of the pixel electrodes 171. The bank 190 may be disposed in the third contact holes CT3. That is, the third contact holes CT3 may be filled with the bank 190. The bank 190 may be formed as an organic film including an acrylic resin, an epoxy resin, a phenolic resin, a polyamide resin, or a polyimide resin.

A spacer 191 may be disposed on the bank 190. The spacer 191 may support a mask during the formation of the light-emitting layers 172. The spacer 191 may be formed as an organic film including an acrylic resin, an epoxy resin, a phenolic resin, a polyamide resin, or a polyimide resin.

The light-emitting layers 172 are formed on the pixel electrodes 171. The light-emitting layers 172 may include an organic material and may thus emit light of a particular color. In an embodiment, the light-emitting layers 172 may include hoe transport layers, organic material layers, and electron transport layers, for example. The organic material layers may include a host and a dopant. The organic material layers may include a material capable of emitting light of a particular color and may include or consist of a phosphor or a fluorescent material.

The common electrode 173 is formed on the light-emitting layers 172. The common electrode 173 may cover the light-emitting layers 172. The common electrode 173 may be a common layer formed in common in the emission areas EA. A capping layer may be formed on the common electrode 173.

In the top emission structure, the common electrode 173 may include or consist of a transparent conductive oxide ("TCO") such as ITO or indium zinc oxide ("IZO") or a semi-transmissive metal material such as magnesium (Mg), Ag, or any alloys thereof. In a case where the common electrode 173 includes or consists of a semi-transmissive metal material, the emission efficiency of the light-emitting elements LEL may be improved due to microcavities.

The encapsulation layer ENC may be formed on the light-emitting element layer EML. The encapsulation layer ENC may include at least one inorganic films to prevent the penetration of oxygen or moisture into the light-emitting element layer EML. The encapsulation layer may also include at least one organic film to protect the light-emitting element layer EML from a foreign material such as dust. In an embodiment, the encapsulation layer ENC may include a first encapsulation inorganic film TFE1, an encapsulation organic film TFE2, and a second encapsulation inorganic film TFE3, for example.

The first encapsulation inorganic film TFE1 may be disposed on the common electrode 173, the encapsulation organic film TFE2 may be disposed on the first encapsulation inorganic film TFE1, and the encapsulation organic film TFE2 may be disposed on the second encapsulation inorganic film TFE3. Each of the first and second encapsulation inorganic films TFE1 and TFE3 may be formed as a multilayer in which at least one layer among a silicon nitride layer, a silicon oxynitride layer, a silicon oxide layer, a titanium oxide layer, and an aluminum oxide layer is alternately stacked. The encapsulation organic film TFE2 may be formed as an organic film including an acrylic resin, an epoxy resin, a phenolic resin, a polyamide resin, or a polyimide resin.

The sensor electrode layer SENL is disposed on the encapsulation layer ENC. The sensor electrode layer SENL may include sensor electrodes (TE and RE).

A second buffer film BF2 may be disposed on the encapsulation layer ENC. The second buffer film BF2 may include at least one inorganic film. In an embodiment, the second buffer film BF2 may be formed as a multilayer in which at least one layer among a silicon nitride layer, a silicon oxynitride layer, a silicon oxide layer, a titanium oxide layer, and an aluminum oxide layer is alternately stacked, for example. The second buffer film BF2 may be optional.

First connectors BE1 may be disposed on the second buffer film BF2. The first connectors BE1 may be formed as single layers including Mo, Ti, Cu, or Al or as stacks of Al and ITO (e.g., ITO/Al/ITO), stacks of an APC alloy, or stacks of an APC alloy and ITO (e.g., ITO/APC/ITO).

A first sensor insulating film TINS1 may be disposed on the first connectors BE1. The first sensor insulating film TINS1 may be formed as an inorganic film such as a silicon nitride layer, a silicon oxynitride layer, a silicon oxide layer, a titanium oxide layer, or an aluminum oxide layer.

The sensor electrodes (TE and RE), i.e., driving electrodes TE and sensing electrodes RE, may be disposed on the first sensor insulating film TINS1. Dummy patterns may also be disposed on the first sensor insulating film TINS1. In an embodiment, a test contact hole TCNT1 may be defined in a driving electrodes TE.

The driving electrodes TE, the sensing electrodes RE, and the dummy patterns may not overlap with the emission areas EA. The driving electrodes TE, the sensing electrodes RE, and the dummy patterns may be formed as single layers including Mo, Ti, Cu, or Al or as stacks of Al and ITO (e.g., ITO/Al/ITO), stacks of an APC alloy, or stacks of an APC alloy and ITO (e.g., ITO/APC/ITO).

A second sensor insulating film TINS2 may be disposed on the driving electrodes TE, the sensing electrodes RE, and the dummy patterns. The second sensor insulating film TINS2 may include at least one of an inorganic film and an organic film. The inorganic film may include a silicon nitride layer, a silicon oxynitride layer, a silicon oxide layer, a titanium oxide layer, or an aluminum oxide layer. The organic film may include an acrylic resin, an epoxy resin, a phenolic resin, a polyamide resin, or a polyimide resin.

FIG. 6 is a plan view of an area A of FIG. 2. FIG. 6 illustrates parts of the display area DA and the non-display area NDA on the right side of the display panel 100.

Referring to FIG. 6, the display area DA may include a plurality of emission areas (EA1, EA2, EA3, and EA4). The emission areas (EA1, EA2, EA3, and EA4) may include first emission areas EA1, which emit first-color light, second emission areas EA2 and fourth emission areas EA4, which emit second-color light, and third emission areas EA3, which emit third-color light. In an embodiment, the first-color light may be red-wavelength light in the range of wavelengths of about 600 nanometers (nm) to about 750 nm, the second-color light may be green-wavelength light in the range of about 480 nm to about 560 nm, and the third-color light may be blue-wavelength light in the range of wavelengths of about 370 nm to about 460 nm, for example. However, the disclosure is not limited to this example.

FIG. 6 illustrates that the second emission areas EA2 and the fourth emission areas EA4 emit light of the same color, i.e., the second-color light, but the disclosure is not limited thereto. In an alternative embodiment, the second emission areas EA2 and the fourth emission areas EA4 may emit light of different colors. In an embodiment, the second emission areas EA2 may emit the second-color light, and the fourth emission areas EA4 may emit fourth-color light, for example.

FIG. 6 illustrates that the first emission areas EA1, the second emission areas EA2, the third emission areas EA3, and the fourth emission areas EA4 have a quadrangular (e.g., rectangular) shape in a plan view, but the disclosure is not limited thereto. In an alternative embodiment, the first emission areas EA1, the second emission areas EA2, the third emission areas EA3, and the fourth emission areas EA4 may have various other shapes such as a polygonal shape other than a quadrangular (e.g., rectangular) shape, a circular shape, or an elliptical shape.

The third emission areas EA3 may have a largest size, and the second emission areas EA2 and the fourth emission areas EA4 may have a smallest size. The second emission areas EA2 and the fourth emission areas EA4 may have the same size.

The second emission areas EA2 and the fourth emission areas EA4 may be alternately arranged in the first direction (or the X-axis direction). The second emission areas EA2 may be arranged in the second direction (or the Y-axis direction). The fourth emission areas EA4 may be arranged in the second direction (or the Y-axis direction). The fourth emission areas EA4 may have long sides in a first diagonal direction and short sides in a second diagonal direction, and the second emission areas EA2 may have long sides in the second diagonal direction and short sides in the first diagonal direction. The first diagonal direction may be a direction between the first direction (or the X-axis direction) and the second direction (or the Y-axis direction), and the second diagonal direction may be orthogonal to the first diagonal direction.

The first emission areas EA1 and the third emission areas EA3 may be alternately arranged in the first direction (or the X-axis direction). The first emission areas EA1 may be arranged in the second direction (or the Y-axis direction). The third emission areas EA3 may be arranged in the second direction (or the Y-axis direction). The first emission areas EA1 and the third emission areas EA3 may have a square shape in a plan view, but the disclosure is not limited thereto. In this case, the first emission areas EA1 and the third emission areas EA3 may have two parallel sides in the first diagonal direction and two parallel sides in the second diagonal direction.

The non-display area NDA may include first and second non-display areas NDA1 and NDA2. The first non-display area NDA1 may be an area in which structures for driving the pixels in the display area DA. The second non-display area NDA2 may be disposed on the outside of the first non-display area NDA1. The second non-display area NDA2 may be an edge part of the non-display area NDA. The second non-display area NDA2 may also be an edge part of the display panel 100.

A scan driving circuit unit SDC, a first power supply line VSL, the first dam DAM1, and the second dam DAM2 may be disposed in the first non-display area NDA1.

The scan driving circuit unit SDC may include a plurality of stages STA. The stages STA may be connected to the scan lines in the display area DA, which extend in the first direction (or the X-axis direction). That is, the stages STA may be connected one-to-one to the scan lines in the display area DA, which extend in the first direction (or the X-axis direction). The stages STA may sequentially apply scan signals to the scan lines.

The first power supply line VSL may be disposed on the outside of the scan driving circuit unit SDC. That is, the first power supply line VSL may be disposed closer than the scan driving circuit unit SDC to an edge EG of the display panel 100. The first power supply line VSL may extend in the second direction (or the Y-axis direction), in a non-display area NDA on the left side of the display panel 100.

The first power supply line VSL may be electrically connected to the common electrode 173, and thus, the common electrode 173 may receive a first power supply voltage from the first power supply line VSL.

The first and second dams DAM1 and DAM2 may be structures for preventing the encapsulation organic film TFE2 of the encapsulation layer ENC from spilling over the edge EG of the display panel 100. The first and second dams DAM1 and DAM2 may extend in the second direction (or the Y-axis direction) in the non-display area NDA, on the right side of the display panel 100. The second dam DAM2 may be disposed on the outside of the first dam DAM1. The first dam DAM1 may be disposed closer than the second dam DAM2 to the scan driving circuit unit SDC, and the second dam DAM2 may be disposed closer than the first dam DAM1 to the edge EG of the display panel 100.

FIG. 6 illustrates that the first and second dams DAM1 and DAM2 are disposed on the first power supply line VSL, but the disclosure is not limited thereto. In an embodiment, one of the first and second dams DAM1 and DAM2 may not be disposed on the first power supply line VSL, for example. In another embodiment, none of the first and second dams DAM1 and DAM2 may be disposed on the first power supply line VSL, in which case, the first and second dams DAM1 and DAM2 may be disposed on the outside of the first power supply line VSL.

FIG. 6 illustrates that the display panel 100 includes two dams, i.e., the first and second dams DAM1 and DAM2, but the disclosure is not limited thereto. In an alternative embodiment, in some embodiments, the display panel 100 may include three or more dams.

The first power supply line VSL may be a first outer structure disposed in the first non-display area NDA1. The first outer structure may be disposed further apart than the outermost structures from the edge EG of the display panel 100. That is, the distance between the first power supply line VSL, which is the first outer structure, and the edge EG of the display panel 100 may be greater than the distance between the outermost structures and the edge EG of the display panel 100.

The distance between the first power supply line VSL and the edge EG of the display panel 100 may be less on the left or right side of the display panel 100 than on the upper side of the display panel 100. In an embodiment, the distance between the first power supply line VSL and the edge EG of the display panel 100 may be about 160 micrometers (μm) or less on the left or right side of the display panel 100 and may be about 445 μm or less on the upper side of the display panel 100, for example.

The second dam DAM2 may be a second outer structure disposed in the first non-display area NDA1. The second outer structure may be disposed further apart than the first outer structure from the edge EG of the display panel 100. That is, the distance between the second dam DAM2, which is the second outer structure, and the edge EG of the display panel 100 may be greater than the distance between the first power supply line VSL, which is the first outer structure, and the edge EG of the display panel 100.

The distance between the second dam DAM2 and the edge EG of the display panel 100 may be less on the left or right side of the display panel 100 than on the upper side of the display panel 100. In an embodiment, the distance between the second dam DAM2 and the edge EG of the display panel 100 may be about 220 μm or less on the left side of the display panel 100 and may be about 445 μm or less on the upper side of the display panel 100, for example.

The display device 10 may further include the crack dam CRD, which is disposed in an outermost part of the display panel 100. The crack dam CRD may be a structure for preventing cracks during the cutting of the substrate SUB, as performed during the fabrication of the display device 10. The crack dam CRD may be an outermost structure disposed on the outermost side of the display panel 100. The crack dam CRD may surround the second dam DAM2, on the outermost side of the display panel 100. In an embodiment, the crack dam CRD may extend in the second direction (or the Y-axis direction) in the non-display area NDA, on the left side of the display panel 100, for example. The crack dam CRD may be disposed closer than the second dam DAM2 to the edge EG, in the second non-display area NDA2, and may be disposed between the second dam DAM2 and an edge area EGA.

The second non-display area NDA2 may include the edge area EGA. The edge area EGA may be disposed along the edge EG of the display panel 100. The edge area EGA may be an area in which processing traces are left from the cutting of the substrate SUB.

Figure 7:
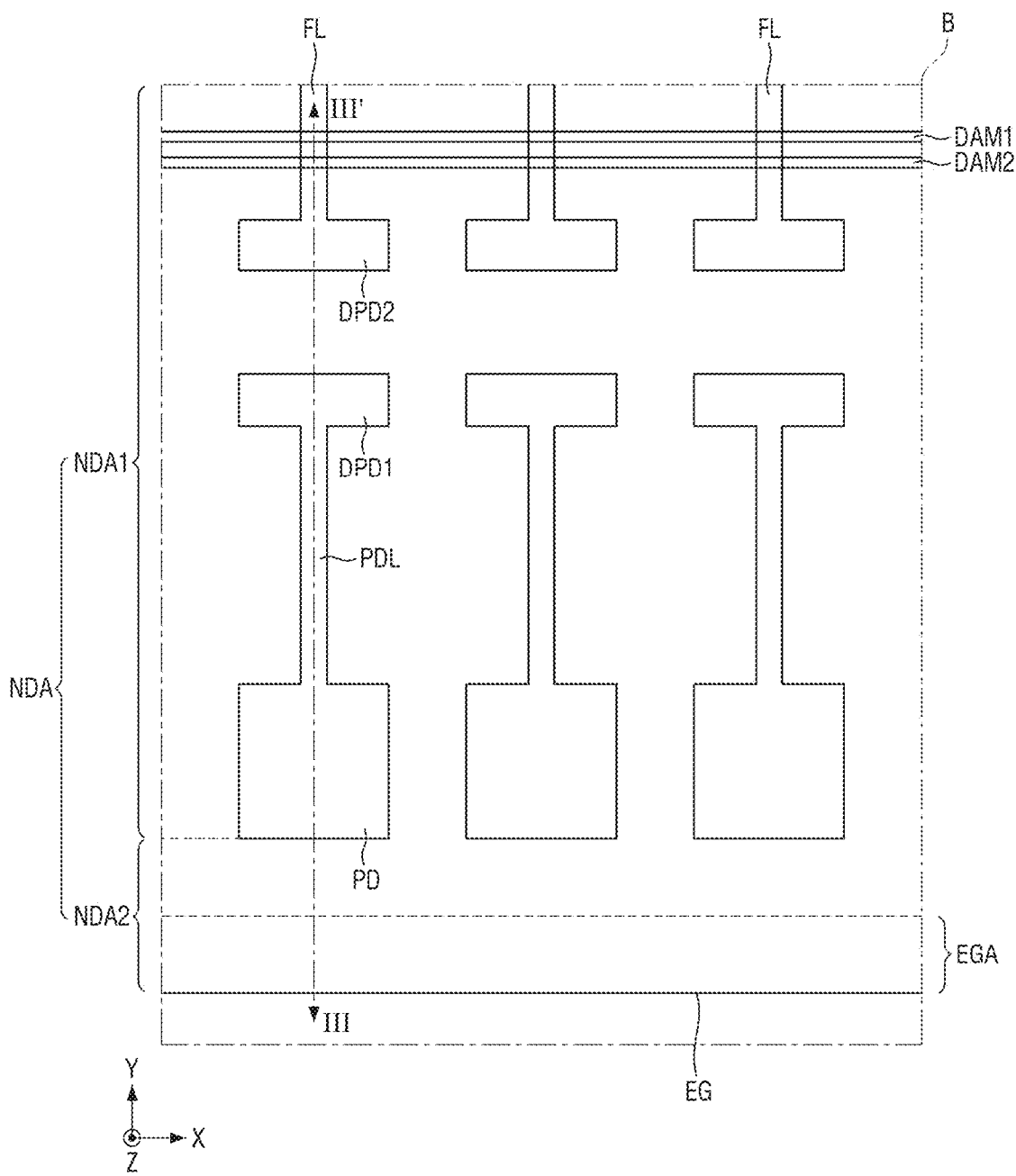
FIG. 7 is a plan view of an area B of FIG. 2.

FIG. 7 is a plan view of an area B of FIG. 2. FIG. 7 illustrates a part of the non-display area NDA on the lower side of the display panel 100.

Referring to FIG. 7, the first non-display area NDA1 may include a plurality of display pads PD, a plurality of first driving pads PDD1, a plurality of second driving pads PDD2, a plurality of pad lines PDL, a plurality of fan-out lines FL, the first dam DAM1, and the second dam DAM2.

The display pads PD may be electrically connected to the circuit boards 300 via conductive adhesive members such as ACFs or anisotropic conductive adhesives. The display pads PD may be connected to the pad lines PDL. The pad lines PDL may connect the display pads PD and the first driving pads DPD1.

The first driving pads DPD1 and the second driving pads DPD2 may be electrically connected to the driver ICs 200 via conductive adhesive members such as ACFs or anisotropic conductive adhesives. The first driving pads DPD1 may be input pads for allowing the driver ICs 200 to receive signals (e.g., digital video data or data timing control signals) from the circuit boards 300. The second driving pads DPD2 may be output pads for outputting signals (e.g., data voltages) from the driver ICs 200. The second driving pads DPD2 may be connected to the fan-out lines FL. The fan-out lines FL may connect the second driving pads DPD2 and the data lines in the display area DA.

The first driving pads DPD1 may be disposed closer, in the second direction (or the Y-axis direction), than the display pads PD to the display area DA. That is, the display pads PD, which are connected to the first driving pads DPD1, may be disposed closer, in the second direction (or the Y-axis direction), than the first driving pads DPD1 to the edge EG of the display panel 100.

The second driving pads DPD2 may be disposed closer, in the second direction (or the Y-axis direction), than any one of the first driving pads DPD1 to the display area DA. That is, the first driving pads DPD1 may be disposed closer, in the second direction (or the Y-axis direction), than any one of the second driving pads DPD2 to the edge EG of the display panel 100.

The first and second dams DAM1 and DAM2 may intersect the fan-out lines FL. The first and second dams DAM1 and DAM2 may extend in the first direction (or the X-axis direction) in the non-display area NDA, on the lower side of the display panel 100. The second dam DAM2 may be disposed on the outside of the first dam DAM1. The first dam DAM1 may be disposed closer than the second dam DAM2 to the display area DA, and the second dam DAM2 may be disposed closer than the first dam DAM1 to the edge EG of the display panel 100.

Figure 8:
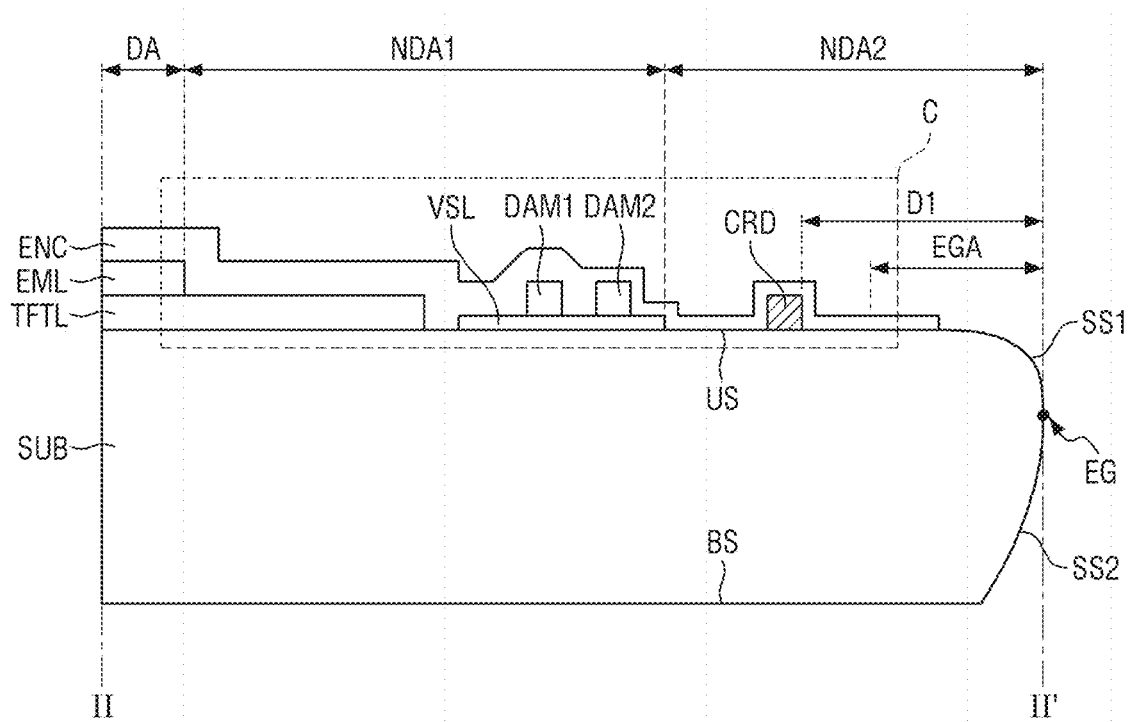
FIG. 8 is a cross-sectional view taken along line II-II' of FIG. 6.
Figure 9:
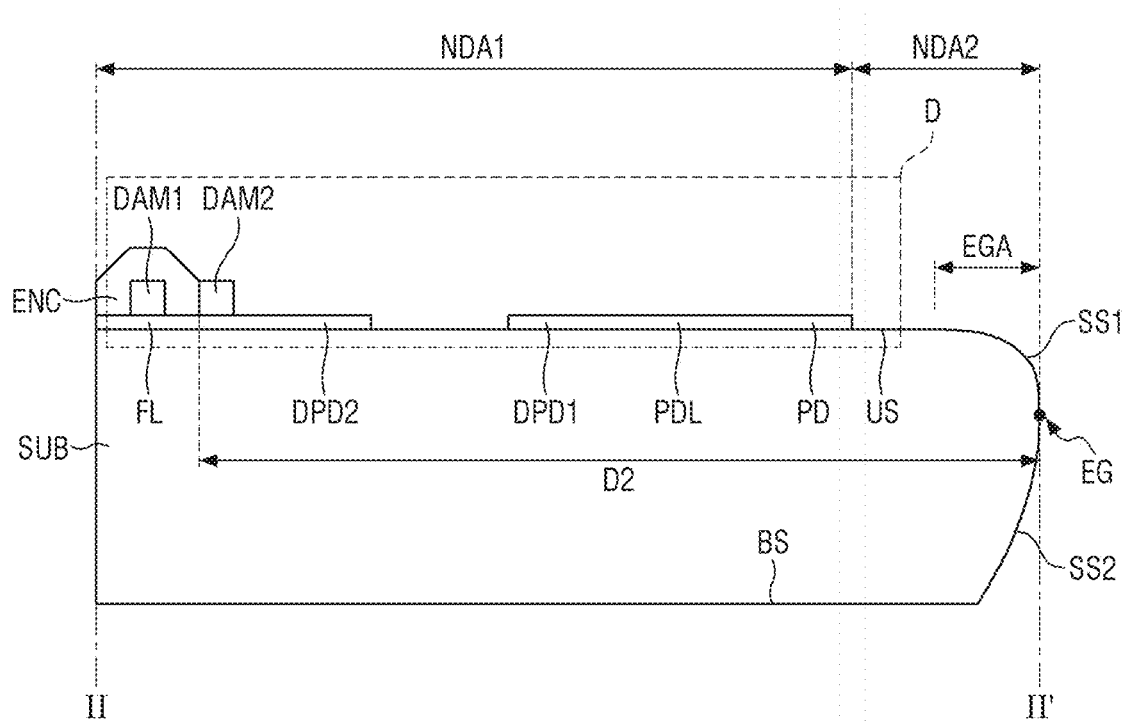
FIG. 9 is a cross-sectional view taken along line III-III' of FIG. 7.

FIG. 8 is a cross-sectional view taken along line II-II' of FIG. 6. FIG. 9 is a cross-sectional view taken along line III-III' of FIG. 7.

FIGS. 8 and 9 illustrate the cross sections of the display panel 100 when the substrate SUB of the display panel 100 is cut by applying intense light (e.g., laser light) and spraying an etchant during the fabrication of the display panel 100.

Referring to FIGS. 8 and 9, the edge area EGA may be an area in which processing traces are defined by laser light applied to cut the substrate SUB. The edge area EGA may have a width of about 50 μm in a horizontal direction in the cross section. The edge area EGA, which has a width of about 50 μm, may be formed along the edge EG of the display panel 100.

The substrate SUB of the display panel 100 may have an upper surface US, on which the light-emitting element layer EML is disposed, a lower surface BS, which is opposite to the upper surface US, and side surfaces (SS1 and SS2), which extend to or from the upper surface US and the lower surface BS and are curved. The substrate SUB of the display panel 100 may include the edge EG, which is an outermost protruding part on the side surfaces (SS1 and SS2), and the side surfaces (SS1 and SS2) may include a first side surface SS1, which is between the edge EG and the upper surface US, and a second side surface SS2, which is between the edge EG and the lower surface BS.

The substrate SUB may be cut out of a mother substrate (MSUB of FIG. 16) by laser irradiation and etching processes during the fabrication of the display device 10. Here, the shape of the side surfaces (SS1 and SS2) of the substrate SUB of the display panel 100 may be controlled by designing the positions of laser spots (SPOT of FIG. 22) on the mother substrate MSUB, to which laser light is applied. The laser spots may form a curved shape in a three-dimensional ("3D") space during the cutting of the substrate SUB from the mother substrate MSUB, and as a result, the side surfaces (SS1 and SS2) of the substrate SUB may have a curved shape.

The laser irradiation and etching processes may be performed, starting from one side of the mother substrate MSUB. The side surfaces (SS1 and SS2) of the substrate SUB may include a side surface adjacent to a surface of the substrate SUB where the laser irradiation and etching processes are performed and a side surface adjacent to the other surface of the substrate SUB where the laser irradiation and etching processes are not performed. The laser irradiation and etching processes may be performed on the lower surface BS of the substrate SUB during the fabrication of the display device 10, and the side surfaces (SS1 and SS2) of the substrate SUB may include the first and second side surfaces SS1 and SS2, which are adjacent to the upper and lower surfaces US and BS, respectively, of the substrate SUB. The first and second side surfaces SS1 and SS2 may have different levels of exposures to the laser irradiation and etching processes, during the cutting of the substrate SUB, and may both have curvature, but have different shapes from each other.

Figure 10:
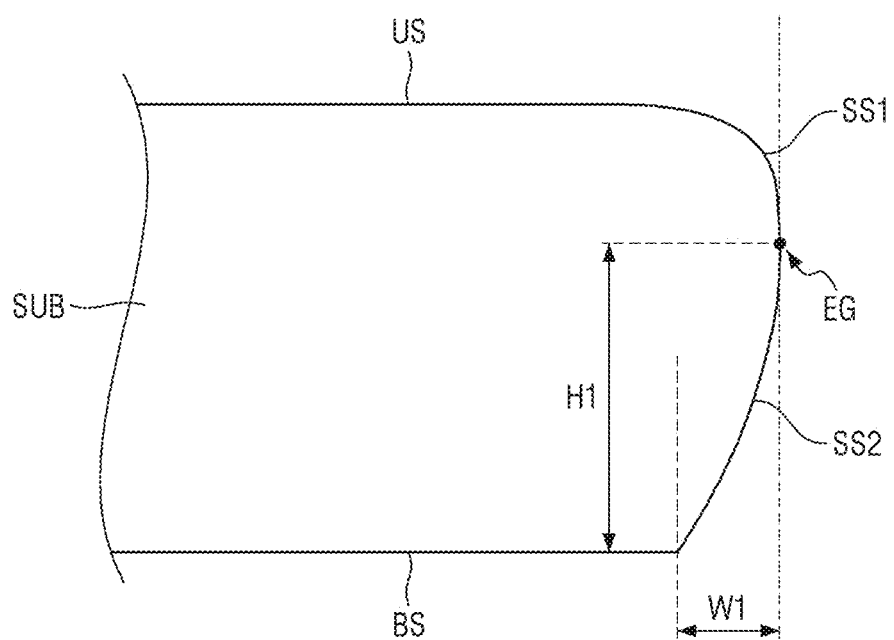
FIG. 10 is a cross-sectional view illustrating an edge portion of a substrate of FIG. 8 or 9.
Figure 11:
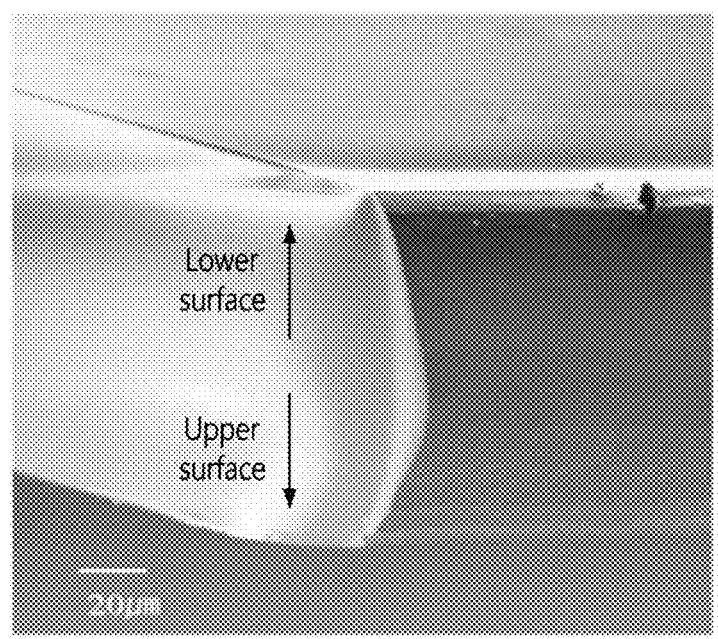
FIG. 11 is a photomicrograph showing an edge portion of a substrate of the display panel of FIG. 2.

FIG. 10 is a cross-sectional view illustrating an edge portion of a substrate of FIG. 8 or 9. FIG. 11 is a photomicrograph showing an edge portion of the substrate of the display panel of FIG. 2.

Referring to FIGS. 10 and 11 and further to FIGS. 8 and 9, the substrate SUB of the display panel 100 may include the edge EG, which is an outermost part of the substrate SUB, and may have the first side surface SS1, which is between the edge EG and the upper surface US, and the second side surface SS2, which is between the edge EG and the lower surface BS. The first and second side surfaces SS1 and SS2 may have curvature and may be curved from the end of the top or lower surface US or BS to the edge EG. The curvature of the first and second side surfaces SS1 and SS2 may vary depending on the design of the laser spots SPOT (e.g., the positions of, and the distance between, the laser spots SPOT) in the laser irradiation process. The edge EG may not be disposed at the center (in a thickness direction) of the substrate SUB, but may be closer to the upper surface US than to the lower surface BS. As a result, the first and second side surfaces SS1 and SS2 may have different lengths from each other. In an embodiment, the length of the first side surface SS1 may be less than the length of the second side surface SS2, and the curvature of the first side surface SS1 may be greater than the curvature of the second side surface SS2, for example. That is, the second side surface SS2 may have a gentler curvature than the first side surface SS1.

The second side surface SS2 may have a radius of a curvature of about 200 μm to about 300, about 220 μm to about 260 μm, or about 240 μm. A width W1 by which the second side surface SS2 protrudes from the end of the lower surface BS to the edge EG may be about 10% to about 20% of the overall thickness of the substrate SUB. In an embodiment where the overall thickness of the substrate SUB is about 200 μm, the width W1 may be about 20 μm to about 40 m or about 30 μm. In some embodiments, the width W1 may be about 27.01 μm. The second side surface SS2, which is adjacent to the lower surface BS where display cells DPC are not disposed, may have a gentler curvature than the first side surface SS1, and the impact resistance of the substrate SUB may be strengthened.

When the side surfaces (SS1 and SS2) are not parallel to the upper and lower surfaces US and BS, but are orthogonal to, or inclined with respect to, the upper and lower surfaces US and BS, the substrate SUB of the display panel 100 may be weak against external shock. In order to address this, the display device 10 may have the side surfaces (SS1 and SS2), which have a relatively gentle curvature with respect to the upper and lower surfaces US and BS, and may thus be robust against external shock. The shape of the side surfaces (SS1 and SS2) may vary depending on the conditions for the laser irradiation and etching processes. This will be described later.

A vertical distance H1 between the lower surface BS and the edge EG may be about 50% to about 60% of the overall thickness of the substrate SUB. In an embodiment, in a case where the overall thickness of the substrate SUB is about 200 μm, the vertical distance H1 may be about 100 μm to about 120 μm or about 110 μm, for example. In an embodiment, the vertical distance H1 may be about 109.2 μm, for example. The position of the edge EG may vary depending on the design of the laser spots SPOT, to which laser light is to be applied during the cutting of the substrate SUB, and the conditions for the etching process to be performed after the laser irradiation process.

During the cutting of the substrate SUB, the etching process, which follows the laser irradiation process, may be performed on the lower surface BS of the substrate SUB. During the etching process, the substrate SUB may be cut out of the mother substrate MSUB, along areas irradiated with laser light, and the surface shape of the side surfaces (SS1 and SS2) of the substrate SUB may vary depending on the direction in which the mother substrate MSUB is etched.

Figure 12:
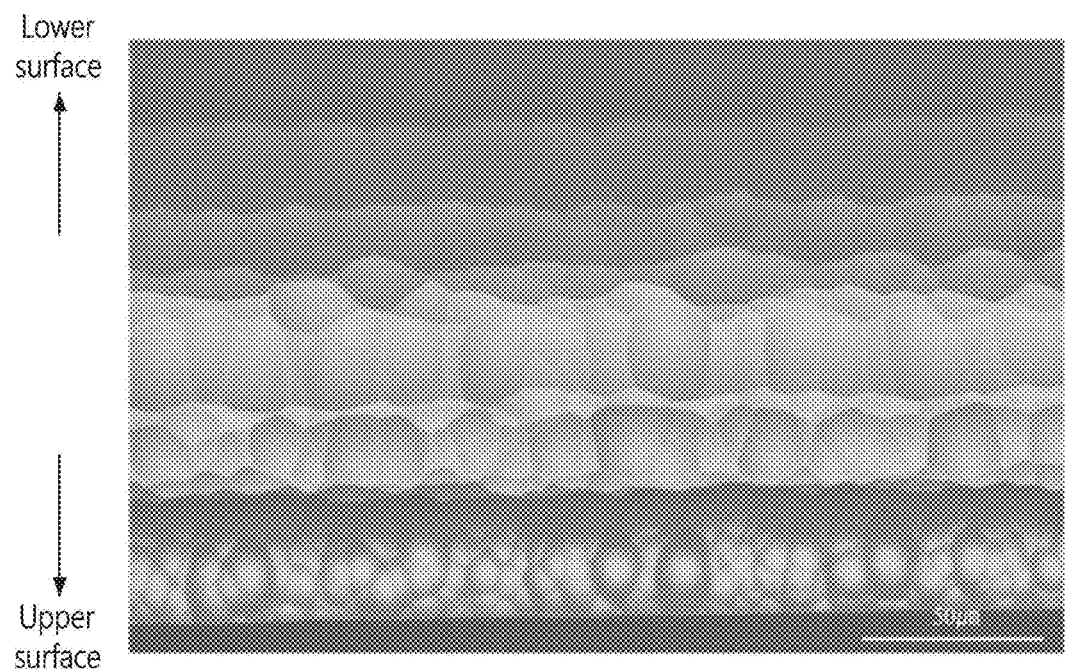
FIG. 12 is a photomicrograph showing cut surfaces on the edge portion of the substrate of the display panel of FIG. 11.

FIG. 12 is a photomicrograph showing cut surfaces on the edge portion of the substrate of the display panel of FIG. 11. FIG. 12 shows the side surfaces (SS1 and SS2) as cut surfaces of the substrate SUB.

Referring to FIG. 12, the substrate SUB of the display panel 100 may be a glass substrate, and parts of the side surfaces (SS1 and SS2) adjacent to the upper or lower surface US or BS may have different surface shapes. During the cutting of the substrate SUB, the etching process may cut the substrate SUB from the mother substrate MSUB, along areas where laser light is applied during a laser irradiation process, and may form glass pores on the surfaces of the substrate SUB. The size of the glass pores may decrease depending on the direction in which the etching process is performed after the laser irradiation process.

The etching process may be performed in a direction from the lower surface BS to the upper surface US of the substrate SUB, and the size of the glass pores may be greater near the lower surface BS than near the upper surface US. In an embodiment, the average size of glass pores formed on a part of the second side surface SS2, which is adjacent to the lower surface BS, may be greater than the average size of glass pores formed on a part of the first side surface SS1, which is adjacent to the upper surface US, for example.

The size of glass pores on a part of the second side surface SS2 that adjoins the lower surface BS may be greater than the size of glass pores on a part of the second side surface SS2 near the edge EG. Also, the size of glass pores on a part of the first side surface SS1 near the edge EG may be greater than the size of glass pores on a part of the first side surface SS1 that adjoins the upper surface US. The size of the glass pores may increase in a direction from the lower surface BS to the upper surface US. The average size of the glass pores on the first side surface SS1 may be about 5 μm to about 30 μm, and the average size of the glass pores on the second side surface SS2 may be about 30 μm to about 50 μm. Referring to FIG. 12, the substrate SUB may have a surface shape similar to that of the second side surface SS2, near the lower surface BS, and a surface shape similar to that of the first side surface SS1, near the upper surface US. The substrate SUB may have curved side surfaces (SS1 and SS2) with glass pores formed thereon as traces from the fabrication of the substrate SUB.

However, the disclosure is not limited to this. In alternative embodiments, during the cutting of the substrate SUB, the etching process may be performed on both the upper and lower surfaces US and BS. In this case, the length and curvature of the first and second side surfaces SS1 and SS2 and the size of glass pores formed on the first and second side surfaces SS1 and SS2 may differ from those described above.

The crack dam CRD may be a structure for preventing cracks during the cutting of the substrate SUB. The crack dam CRD may be an outermost structure disposed on the outermost side of the display panel 100, from the left of the display panel 100. The distance between the crack dam CRD and the edge area EGA may be about 30 μm or less. The distance between the crack dam CRD and the edge area EGA may be about 0 μm.

The distance between the edge EG of the display panel 100 and the encapsulation layer ENC may be about 300 μm or less. In the case of cutting the substrate SUB by applying laser light and then spraying an etchant, the distance between the edge EG of the display panel 100 and the encapsulation layer ENC may vary depending on the unilateral tolerance of the laser light. In an embodiment, when the unilateral tolerance of the laser light is about 50 μm, the distance between the edge EG of the display panel 100 and the encapsulation layer ENC may be about 200 μm or less, for example, but the disclosure is not limited thereto. In an alternative embodiment, the distance between the edge EG of the display panel 100 and the encapsulation layer ENC may be about 0 μm.

A distance D1 (refer to FIG. 8) between the crack dam CRD and the edge EG may be about 130 μm, and the distance between the crack dam CRD and the edge area EGA may be about 80 m. The minimum distance between the crack dam CRD, which is an outermost structure, and the edge EG of the display panel 100 may vary depending on the width of the edge area EGA and the minimum distance between the crack dam CRD and the edge area EGA.

In the case of cutting the substrate SUB by applying laser light and then spraying an etchant, the distance D1 between the crack dam CRD and the edge EG of the display panel 100 may vary depending on the unilateral tolerance of the laser light. In this case, the distance D1 between the crack dam CRD and the edge EG of the display panel 100 may be the sum of the width of the edge area EGA, the minimum distance between the crack dam CRD and the edge area EGA, and the unilateral tolerance of the laser light. In an embodiment, when the minimum distance between the crack dam CRD and the edge area EGA is designed to be about 30 μm or less, the minimum distance between the crack dam CRD and the edge area EGA may be up to about 80 μm or less because the unilateral tolerance of the laser light is about 50 μm, for example. In an alternative embodiment, the minimum distance between the crack dam CRD and the edge area EGA may be about 0 μm.

Similarly, when the minimum distance between the crack dam CRD and the edge area EGA is designed to be about 30 μm or less and the width of the edge area EGA is designed to be about 50 μm, the distance D1 between the crack dam CRD and the edge EG may be up to about 130 μm or less because the unilateral tolerance of the laser light is about 50 μm. The distance D1 between the crack dam CRD and the edge EG will be described later in further detail in connection with how to fabricate the display device 10.

The display pads PD may be outermost structures disposed on the outermost side of the display panel 100, on the lower side of the display panel 100. A distance D2 (refer to FIG. 9) between the edge EG of the display panel 100 and the encapsulation layer ENC may be about 300 m or less on the lower side of the display panel 100. However, as the display pads PD are disposed on the lower side of the display panel 100, the distance D1 between the edge EG and the encapsulation layer ENC, on the left, right, or upper side of the display panel 100, may be less than the distance D2 between the edge EG and the encapsulation layer EG, on the lower side of the display panel 100. The minimum distance between the edge EG and the display pads PD may be about 80 µm or less.

The minimum distance between the edge EG of the substrate SUB and the display pads PD may be the sum of the width of the edge area EGA and the minimum distance between the edge area EGA and the display pads PD. In the case of cutting the substrate SUB by applying laser light and then spraying an etchant, the minimum distance between the edge EG of the substrate SUB and the display pads PD may vary depending on the unilateral tolerance of the laser light. In an embodiment, when the minimum distance between the edge EG of the substrate SUB and the display pads PD is designed to be about 80 µm, the minimum distance between the edge EG of the substrate SUB and the display pads PD may be about 130 µm or less because the unilateral tolerance of the laser light is about 50 µm, for example.

The substrate SUB of the display panel 100 may be cut by applying laser light and then spraying an etchant, and the first and second side surfaces SS1 and SS2 of the display panel 100 may be etched by the etchant. The first and second side surfaces SS1 and SS2 of the display panel 100 may have a roughness of about 0.5 µm or less. The roughness of the first and second side surfaces SS1 and SS2 of the display panel 100 may be less when the substrate SUB is cut by applying laser light and then spraying an etchant than when the substrate SUB is cut with a cutting member and then polished.

As already mentioned above, as during the cutting of the substrate SUB, the etching process is performed, starting from the lower surface BS of the substrate SUB, the first and second side surfaces SS1 and SS2 of the display panel 100 may have different levels of exposure to an etchant. As a result, the first and second side surfaces SS1 and SS2 may have different roughnesses. In an embodiment, the roughnesses of the first and second side surfaces SS1 and SS2 may differ by as much as about 1% to about 20%, for example.

Figure 13:
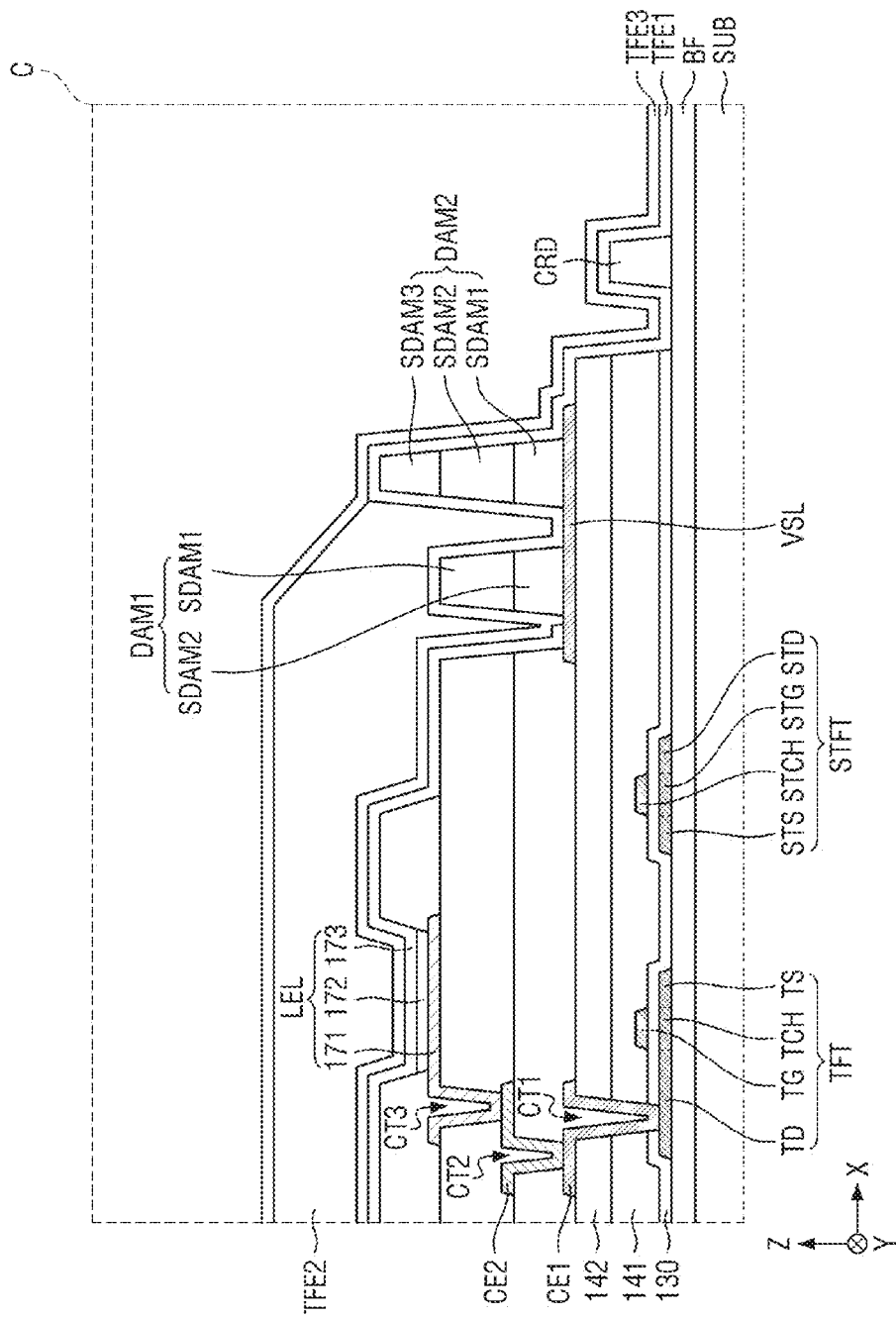
FIG. 13 is a cross-sectional view of an area C of FIG. 8.

FIG. 13 is a cross-sectional view of an area C of FIG. 8. FIG. 13 illustrates the cross-sectional structure of a right-side part of the display panel 100.

Referring to FIG. 13, the first power supply line VSL may include the same material as that of the first data metal layer, which includes the first connecting electrodes CE1 and the data lines, and may be disposed in the same layer as the first data metal layer. The first power supply line VSL may be disposed on the second inter-insulating film 142. The first power supply line VSL may be formed as a single layer or a multilayer including one of Mo, Al, Cr, Au, Ti, Ni, Nd, Cu, and any alloys thereof.

The first and second dams DAM1 and DAM2 may be disposed on the first power supply line VSL. The first dam DAM1 may include first and second sub-dams SDAM1 and SDAM2, and the second dam DAM2 may include first, second, and third sub-dams SDAM1, SDAM2, and SDAM3. The first sub-dams SDAM1 may include the same material as that of the first organic film 160 and may be disposed in the same layer as the first organic film 160. The second sub-dams SDAM2 may include the same material as that of the second organic film 180 and may be disposed in the same layer as the second organic film 180. The third sub-dam SDAM3 may include the same material as that of the bank 190 and may be disposed in the same layer as the bank 190.

The height of the first dam DAM1 may be less than the height of the second dam DAM2, but the disclosure is not limited thereto. In an alternative embodiment, the height of the first dam DAM1 may be substantially the same as, or greater than, the height of the second dam DAM2.

The common electrode 173 may be connected to a part of the first power supply line VSL not covered, but exposed by the first organic film 160, the second organic film 180, and the first dam DAM1. Accordingly, the common electrode 173 may receive the first power supply voltage from the first power supply line VSL.

The first encapsulation inorganic film TFE1 may cover the first dam DAM1, the second dam DAM2, and the crack dam CRD, in a part of the non-display area NDA on the left side of the display panel 100. The first encapsulation inorganic film TFE1 may extend from the part of the non-display area NDA on the lower side of the display panel 100 to the edge EG of the display panel 100.

The encapsulation organic film TFE2 may cover the top surface of the first dam DAM1, but not the top surface of the second dam DAM2, but the disclosure is not limited thereto. In an alternative embodiment, the encapsulation organic film TFE2 may not cover both the top surfaces of the first and second dams DAM1 and DAM2. The encapsulation organic film TFE2 may not spill over the edge EG of the display panel 100 due to the first and second dams DAM1 and DAM2.

The second encapsulation inorganic film TFE3 may cover the first dam DAM1, the second dam DAM2, and the crack dam CRD, in the part of the non-display area NDA on the left side of the display panel 100. The second encapsulation inorganic film TFE3 may extend to the edge EG of the display panel 100, in the part of the non-display area NDA on the left side of the display panel 100.

An inorganic encapsulation area where the first and second encapsulation inorganic films TFE1 and TFE3 contact each other may range from the second dam DAM2 to the edge EG of the display panel 100. The inorganic encapsulation area may surround the second dam DAM2. As the encapsulation layer ENC extends to the edge EG and the display panel 100 includes the crack dam CRD, which is disposed in an outer part of the display panel 100, reliability may be secured in regions in the display panel 100 where inorganic films are disposed directly on the substrate SUB. The first and second encapsulation inorganic films TFE1 and TFE3 of the encapsulation layer ENC may extend to the edge EG of the display panel 100, and the edge area EGA may overlap with the encapsulation layer ENC.

The crack dam CRD may include the same material as that of the first organic film 160 and may be disposed on the buffer layer BF, but the disclosure is not limited thereto. In an alternative embodiment, the crack dam CRD, like the first organic film 160, may be disposed on the second inter-insulating film 142. The crack dam CRD may be formed as an organic film including an acrylic resin, an epoxy resin, a phenolic resin, a polyamide resin, or a polyimide resin. The width of the crack dam CRD may be about 30 µm.

FIG. 13 illustrates that the crack dam CRD includes one organic film, but the disclosure is not limited thereto. In an alternative embodiment, the crack dam CRD may further include another organic film including the same material as that of the second organic film 180. In an alternative embodiment, the crack dam CRD may further include another organic film including the same material as that of the bank 190. In an alternative embodiment, the crack dam CRD may further include another organic film including the same material as that of the spacer 191.

FIG. 13 illustrates a scan thin-film transistor STFT of the scan driving circuit unit SDC. In an embodiment, the scan thin-film transistor STFT may include a source region STS, a channel region STCH, a gate electrode STG, and a drain region STD. The scan thin-film transistor STFT is substantially the same as the thin-film transistors TFT described above with reference to FIG. 6, and thus, a detailed description thereof will be omitted.

Figure 14:
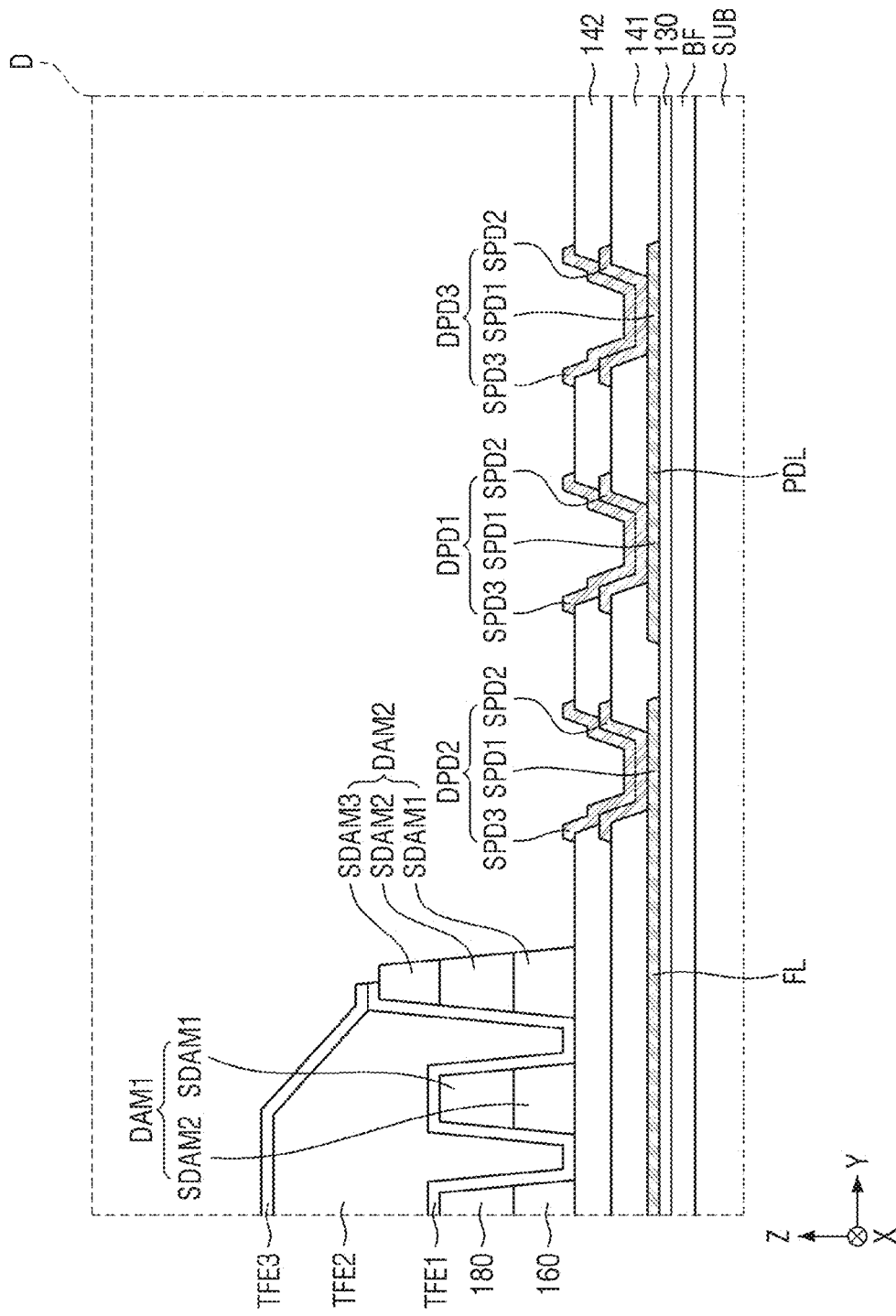
FIG. 14 is a cross-sectional view of an area D of FIG. 9.

FIG. 14 is a cross-sectional view of an area D of FIG. 9. FIG. 14 illustrates the cross-sectional structure of a lower-side part of the display panel 100.

Referring to FIG. 14, each of the display pads PD, the first driving pads DPD1, and the second driving pads DPD2 may include first, second, and third sub-pads SPD1, SPD2, and SPD3.

First sub-pads SPD1 may include the same material as that of the first gate metal layer, which includes the gate electrodes TG, the first capacitor electrodes CAE1 of the capacitors Cst, and the scan lines, and may be disposed in the same layer as the first gate metal layer. The first sub-pads SPD1 may be disposed on the gate insulating film 130. The first sub-pads SPD1 may be formed as single layers or multilayers including one of Mo, Al, Cr, Au, Ti, Ni, Nd, Cu, and any alloys thereof.

Second sub-pads SPD2 may include the same material as that of the second gate metal layer, which includes the second capacitor electrodes CAE2, and may be disposed in the same layer as the second gate metal layer. The second sub-pads SPD2 may be disposed on the first inter-insulating film 141. The second sub-pads SPD2 may be formed as single layers or multilayers including one of Mo, Al, Cr, Au, Ti, Ni, Nd, Cu, and any alloys thereof.

Third sub-pads SPD3 may include the same material as that of the first data metal layer, which includes the first connecting electrodes CE1 and the data lines, and may be disposed in the same layer as the first data metal layer. The third sub-pads SPD3 may be disposed on the second inter-insulating film 142. The third sub-pads SPD3 may be formed as single layers or multilayers including one of Mo, Al, Cr, Au, Ti, Ni, Nd, Cu, and any alloys thereof.

The third sub-pads SPD3 of the display pads PD may be electrically connected to the circuit boards 300 via conductive adhesive members such as ACFs or anisotropic conductive adhesives. The third sub-pads SPD3 of the first driving pads DPD1 may be electrically connected to input bumps of the driver ICs 200 via conductive adhesive members such as ACFs or anisotropic conductive adhesives. The third sub-pads SPD3 of the second driving pads DPD2 may be electrically connected to output bumps of the driver ICs 200 via conductive adhesive members such as ACFs or anisotropic conductive adhesives. For convenience, the driver ICs 200 and the circuit boards 300 are not illustrated in FIG. 14.

The first and second encapsulation inorganic films TFE1 and TFE3 may cover the first dam DAM1 and a part of the second dam DAM2, on the lower side of the display panel 100. In an embodiment, the first and second encapsulation inorganic films TFE1 and TFE3 may be disposed not to cover a part of the top surface of the second dam DAM2, for example. In an alternative embodiment, the first and second encapsulation inorganic films TFE1 and TFE3 may cover the second dam DAM2, but not the third sub-pads SPD3 of the second driving pads DPD2. That is, the first and second encapsulation inorganic films TFE1 and TFE3 may not extend to the display pads PD, the first driving pads DPD1, and the second driving pads DPD2, which are disposed adjacent to the edge EG of the display panel 100, on the lower side of the display panel 100.

The fabrication of the display device 10 will hereinafter be described.

Figure 15:
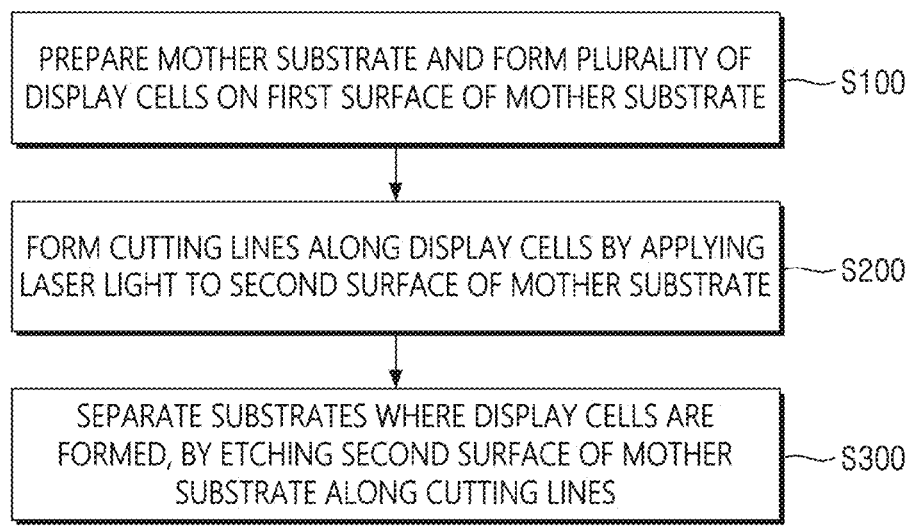
FIG. 15 is a flowchart illustrating an embodiment of a method of fabricating a display device according to the disclosure.

FIG. 15 is a flowchart illustrating an embodiment of a method of fabricating a display device according to the disclosure.

Referring to FIG. 15, the method may include: preparing a mother substrate (MSUB of FIG. 16) and forming a plurality of display cells (DPC of FIG. 16) on one surface of the mother substrate (S100); forming cutting lines (LS of FIG. 17) along the display cells by applying laser light to the other surface of the mother substrate (S200); and separating substrates ("SUB" of FIG. 16) with the display cells formed thereon (S300) by etching the other surface of the mother substrate along the cutting lines LS.

The display device 10 may be formed by separating a substrate with a display cell DPC formed thereon from a mother substrate MSUB where a plurality of display cells DPC is formed. The separation of the substrate SUB from the mother substrate MSUB may involve applying laser light and separating the substrate SUB by etching the mother substrate MSUB. The display device may be fabricated by performing a laser irradiation process, and the size of a boundary portion of the substrate SUB where the display cell DPC is not disposed may be minimized. Side surfaces of the substrate SUB, which is cut out of the mother substrate MSUB, may be curved by designing the positions of laser spots (SPOT of FIG. 22) in the laser irradiation process. Accordingly, the substrate SUB of the display panel 100 of the display device 10 may be resistant to external shock.

The fabrication of the display device 10 will hereinafter be described in further detail.

Figure 21:
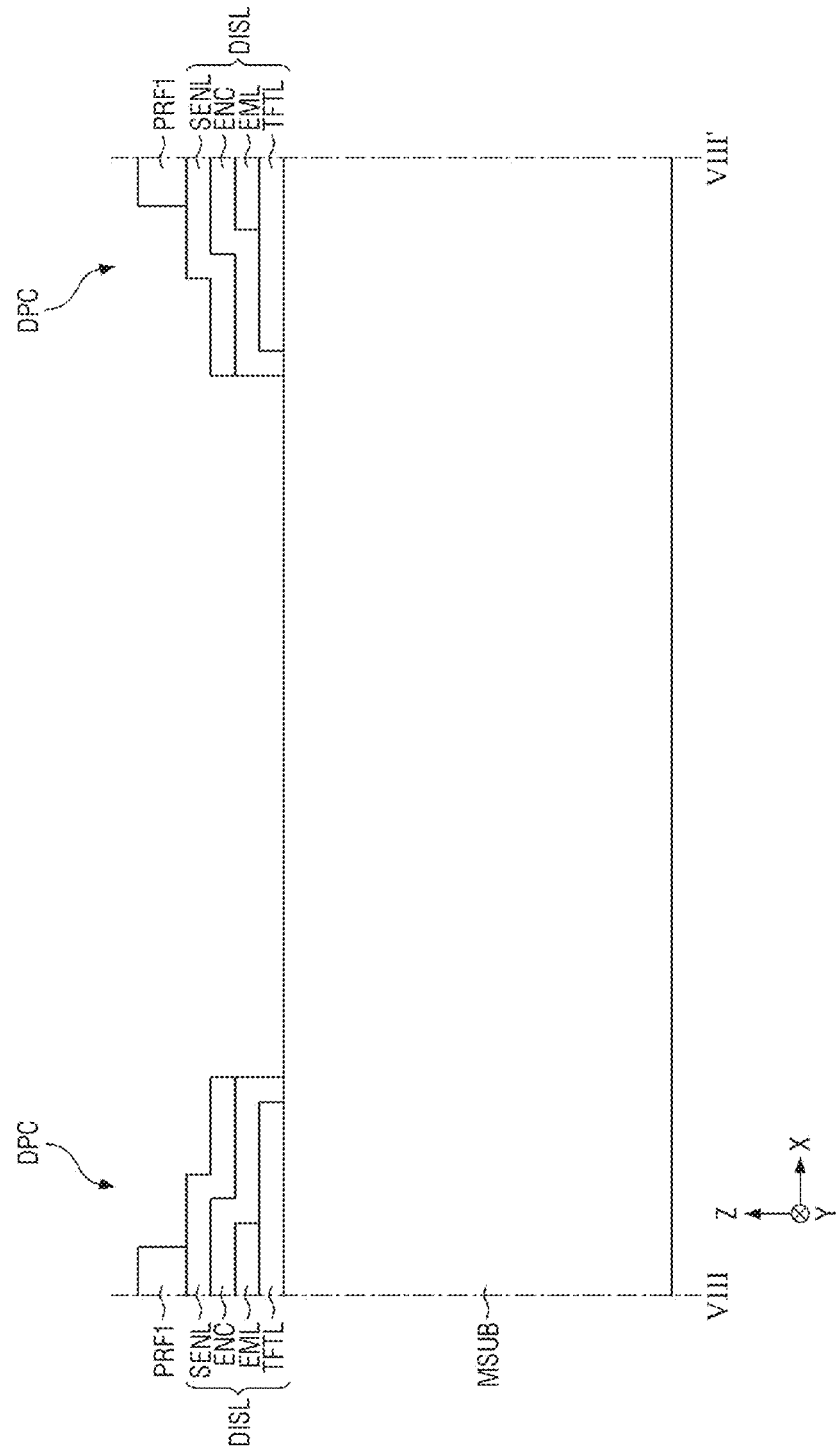
FIGS. 21 and 22 are cross-sectional views illustrating an embodiment of a laser irradiation process as performed in the method of fabricating a display device according to the disclosure.
Figure 22:
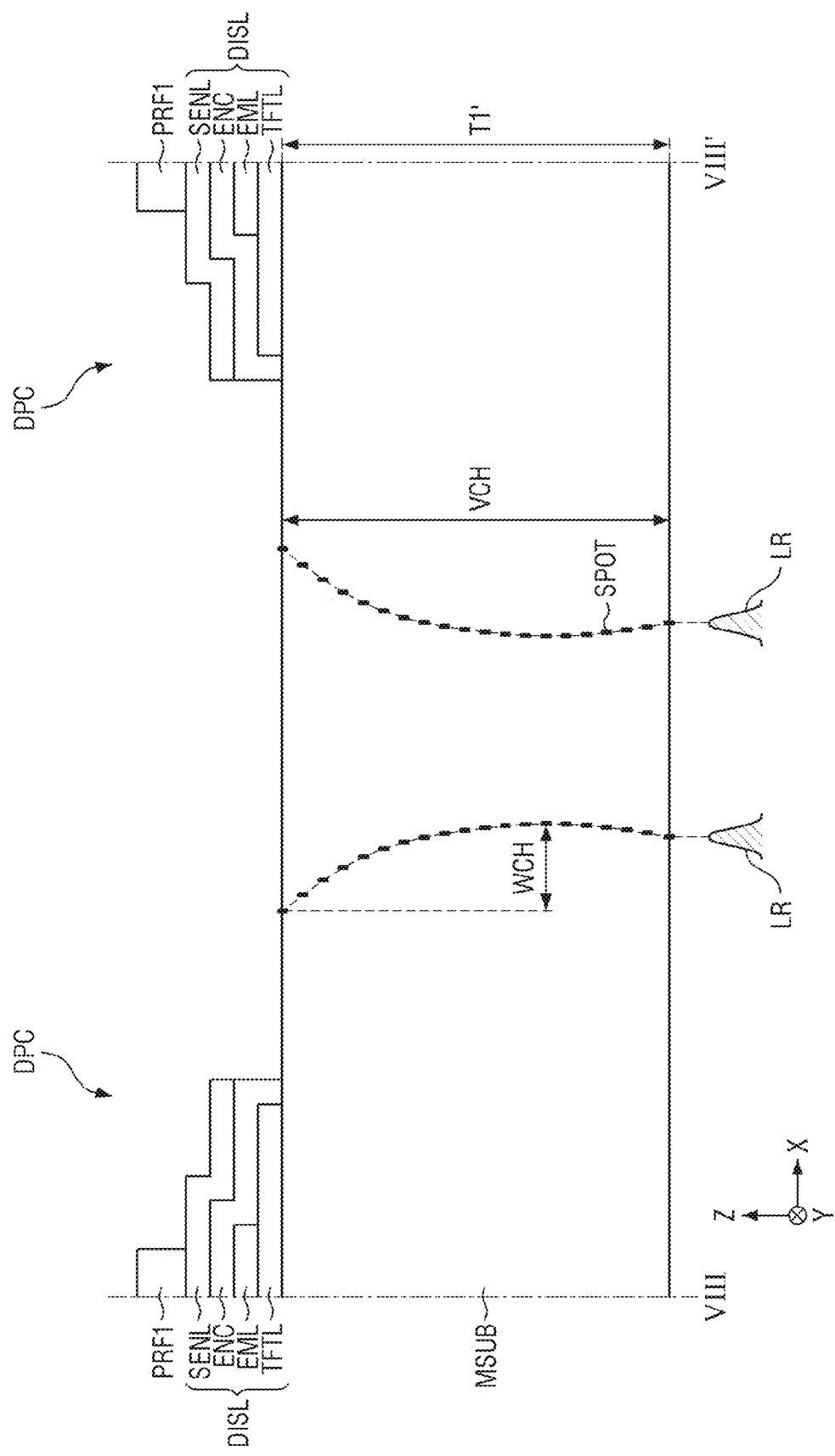
Figure 25:
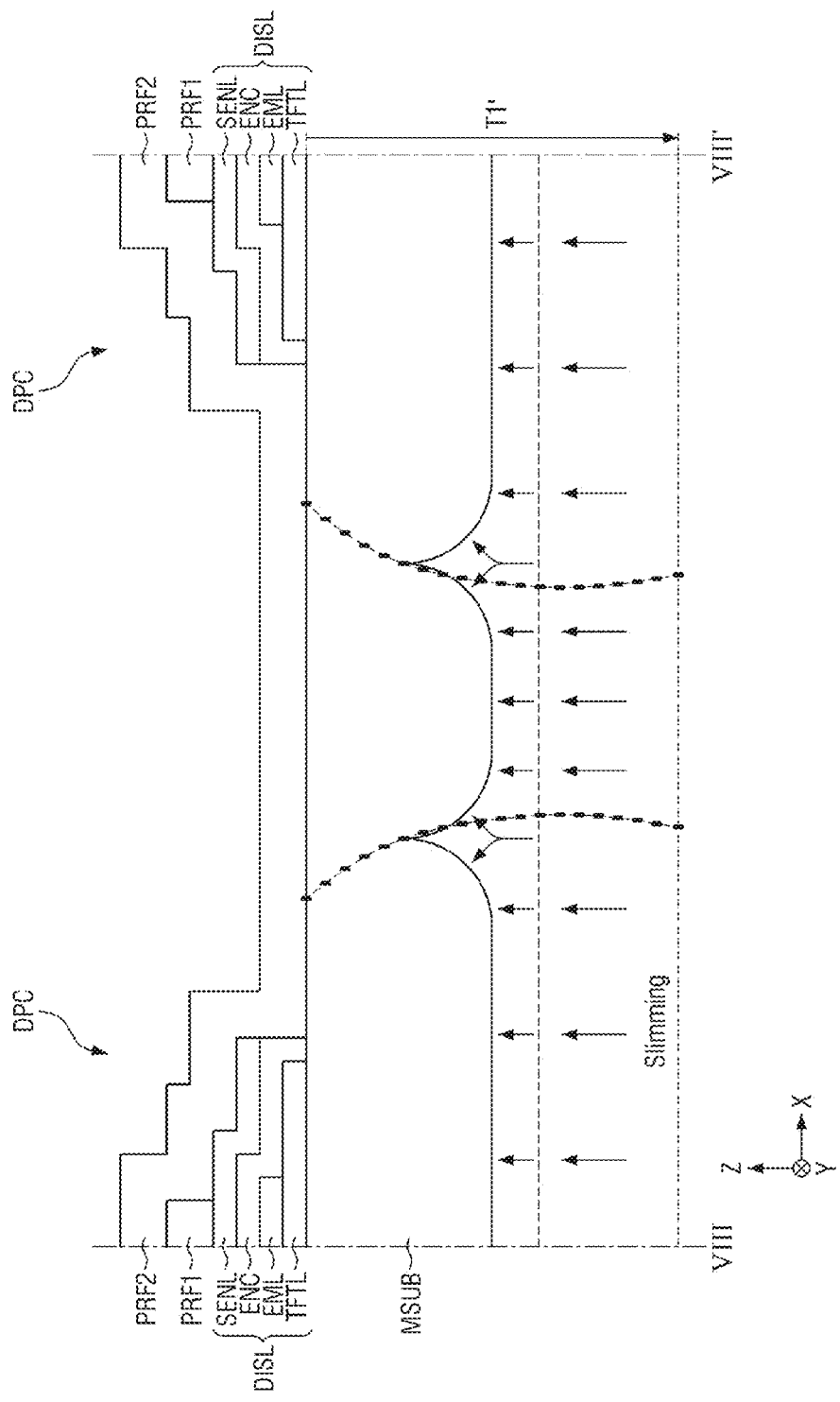
FIGS. 25 through 27 are cross-sectional views illustrating an embodiment of etching and cutting processes as performed in the method of fabricating a display device according to the disclosure.
Figure 26:
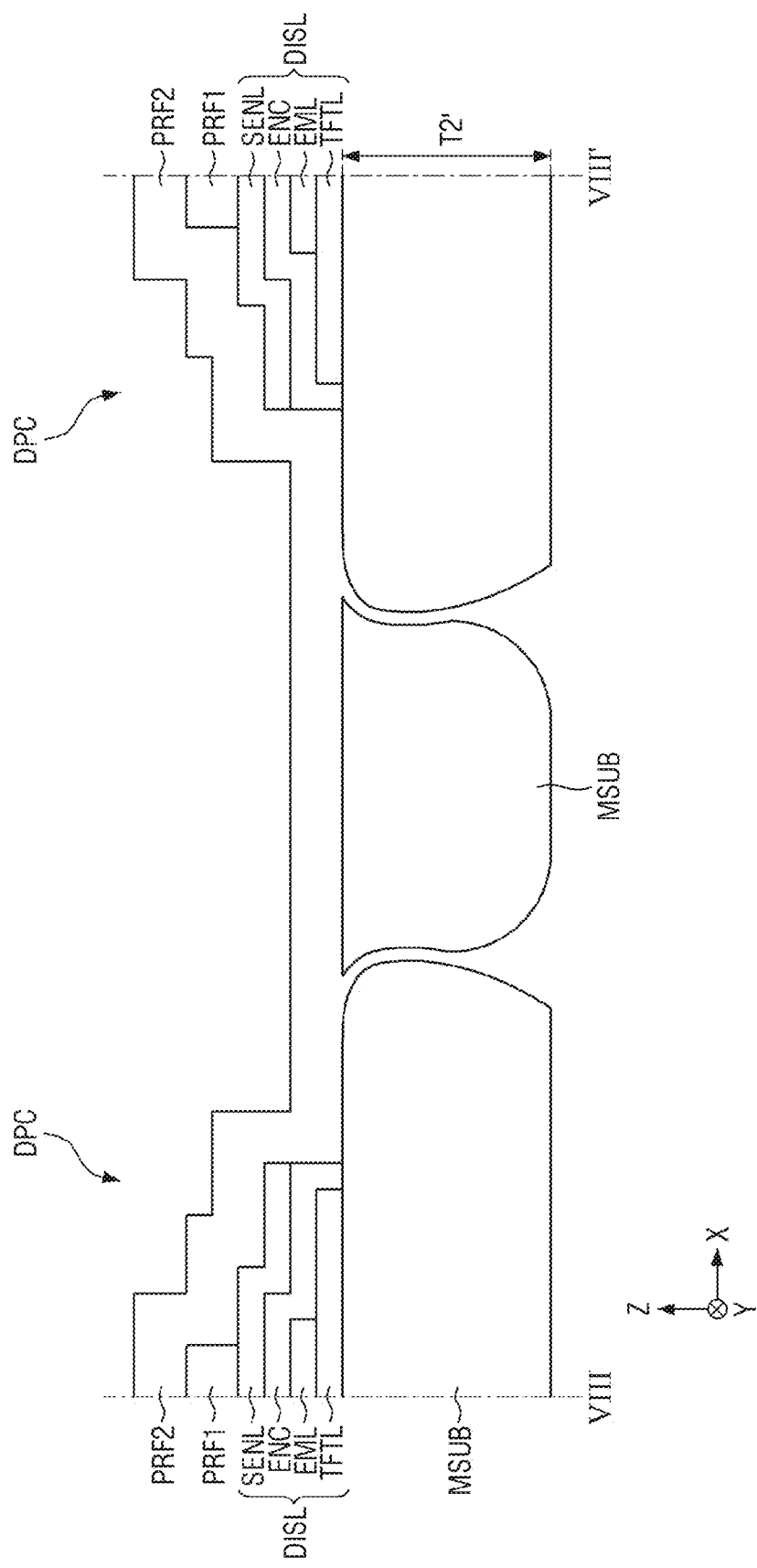
Figure 27:
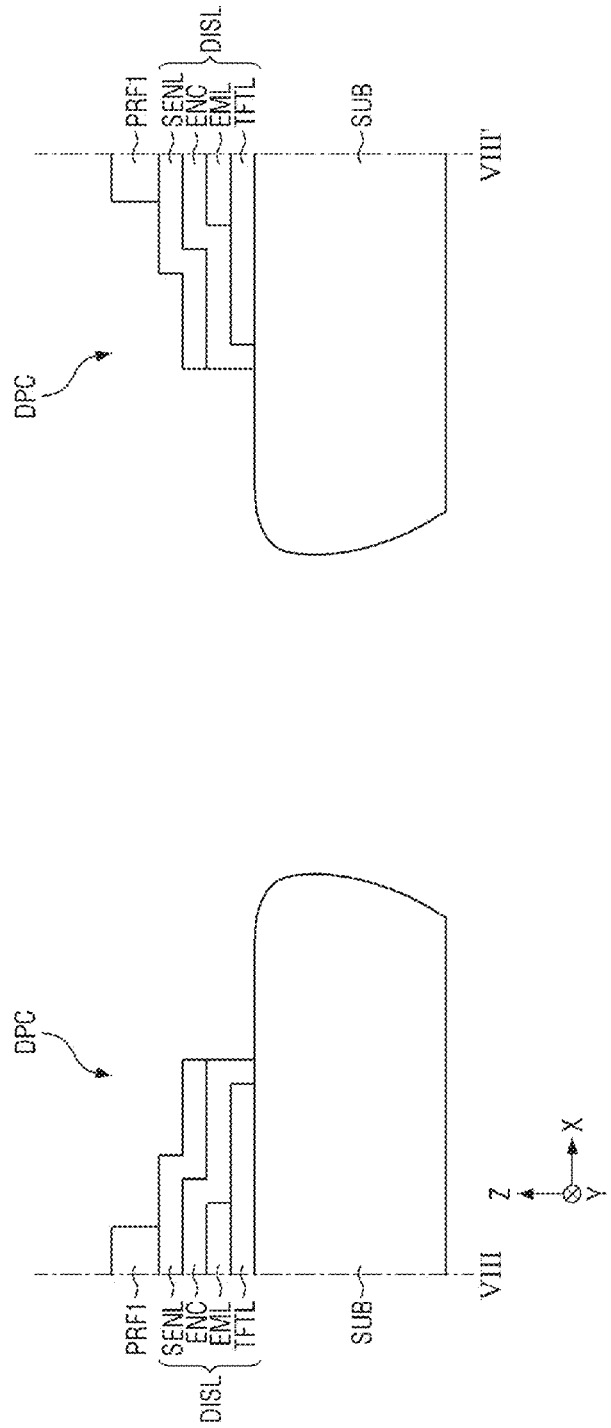

FIGS. 16 through 20 are perspective views illustrating the method of FIG. 15. FIGS. 21 and 22 are cross-sectional views illustrating a laser irradiation process as performed in the method of FIG. 15. FIGS. 25 through 27 are cross-sectional views illustrating etching and cutting processes as performed in the method of FIG. 15.

FIGS. 16 through 20 are perspective views of a mother substrate MSUB with a plurality of display cells DPC disposed thereon. FIGS. 21, 22, and 25 through 27 are cross-sectional views taken along lines VIII-VIII' of FIGS. 16 through 20, respectively.

Figure 16:
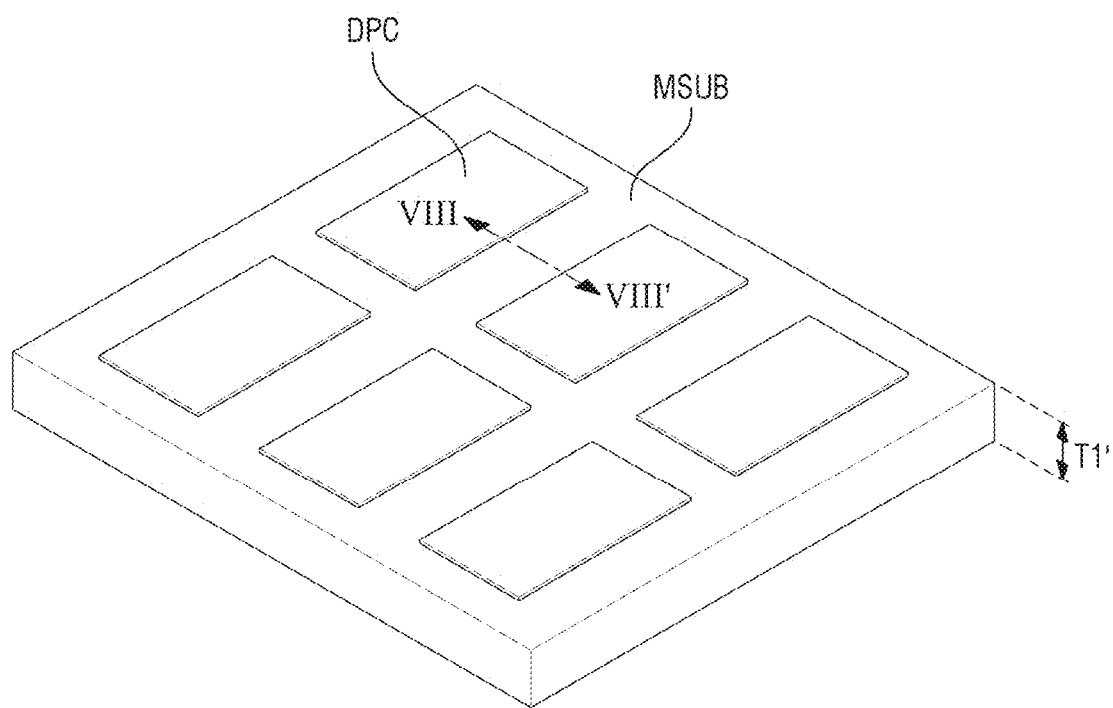
FIGS. 16 through 20 are perspective views illustrating an embodiment of the method of fabricating a display device according to the disclosure.

Referring to FIGS. 16 and 21, a plurality of display cells DPC is formed on a first surface of a mother substrate MSUB, a plurality of first protective films PRF1 is attached on the display cells DPC, and the display cells DPC are inspected.

Display layers DISL of the display cells DPC are formed on the first surface of the mother substrate MSUB. Each of the display layers DISL includes a thin-film transistor layer TFTL, a light-emitting element layer EML, an encapsulation layer ENC, and a sensor electrode layer SENL. The structure of the display layers DISL is as already described above.

Thereafter, a first protective film layer is attached to cover the display cells DPC and parts of the mother substrate MSUB between the display cells DPC. Thereafter, a part of the first protective film layer on the mother substrate MSUB is removed so that the first protective films PRF1 are disposed on the display cells DPC. Parts of the first protective film layer that are not removed may correspond to the first protective films PRF1. The first protective films PRF1 may be disposed on the display cells DPC. The first protective films PRF1 may correspond one-to-one to the display cells DPC.

The first protective films PRF1 may be buffer films for protecting the display cells DPC from external shock. The first protective films PRF1 may include or consist of a transparent material.

Thereafter, the display cells DPC are inspected with an inspection device. Probes are connected to a plurality of test pads provided in the display cells DPC, and a lighting test is performed for each of the display cells DPC.

In a case where the lighting test is performed after the separation of the display cells DPC from the mother substrate MSUB via a cutting process, an additional process for removing the test pads is desired after the lighting test. On the contrary, in a case where the lighting test is performed on the mother substrate MSUB, the test pads are removed when the display cells DPC are separated from the mother substrate MSUB via laser irradiation and etching processes. In this case, the additional process for removing the test pads is not desired.

Figure 17:
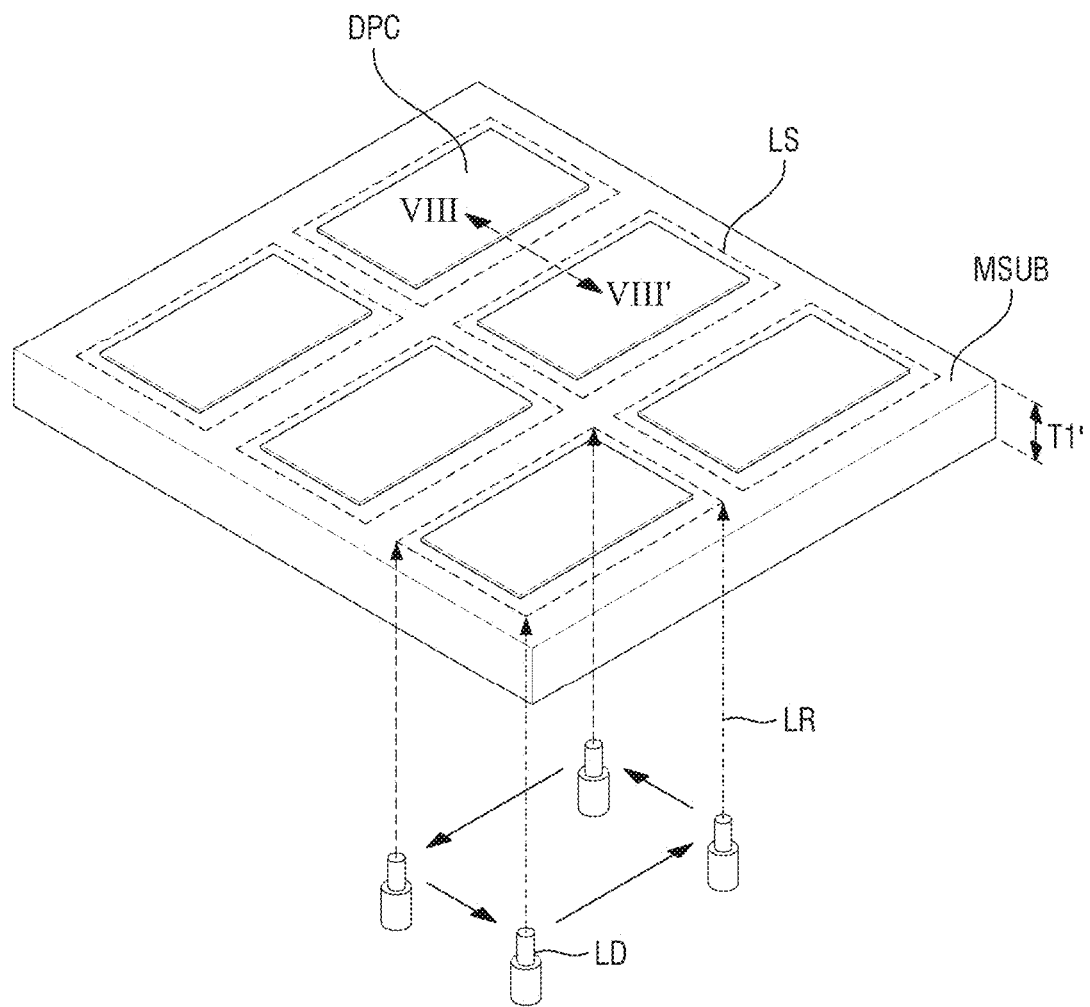
Figure 18:
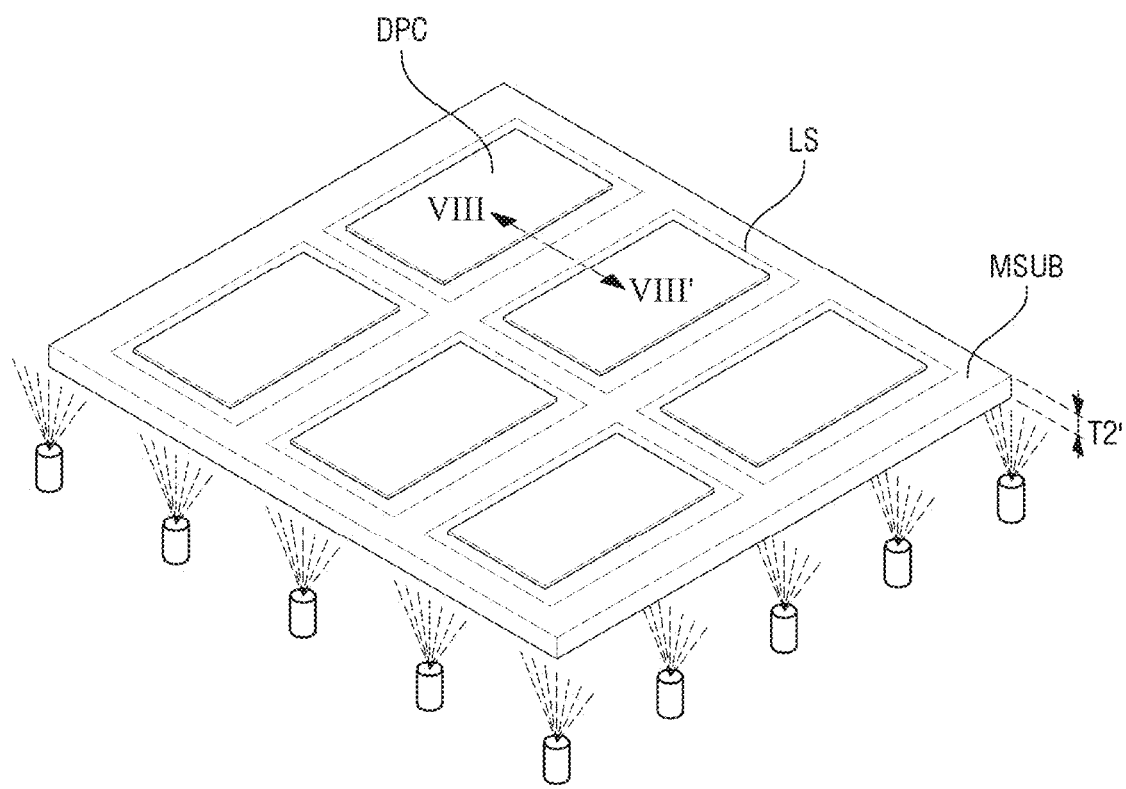
Figure 19:
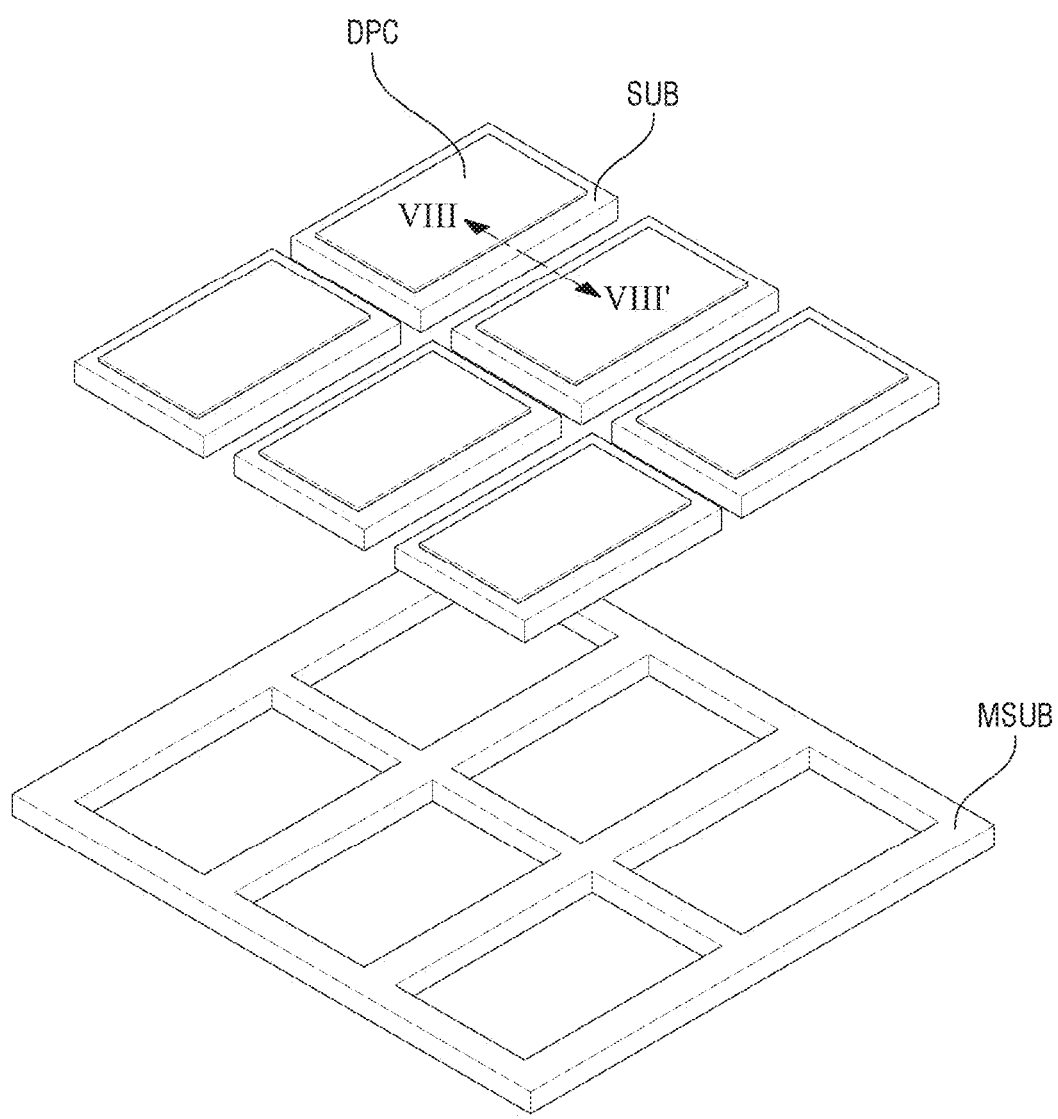

Thereafter, referring to FIGS. 17 and 22, laser spots SPOT are formed along the display cells DPC by applying laser light LR to a second surface of the mother substrate MSUB, which is opposite to the first surface of the mother substrate MSUB.

As the laser spots SPOT are defined by applying the laser light LR along the display cells DPC, the cutting lines LS may be sketched. The cutting lines LS may be formed along the display cells DPC.

Various lasers may be used to apply the laser light LR, which is for sketching the cutting lines LS. The laser light LR may be an infrared Bessel beam having a wavelength of about 1030 nm. The laser light LR may have a repetition frequency of about 10 kilohertz (kHz) to about 1000 kHz, a pulse duration of about 300 femtoseconds (fs) to about 10 picoseconds (ps), and a pulse energy of about 10 μmicrojoules (μJ) to about 500 μJ. Here, the pulse energy per laser spot SPOT may be about 10 μJ or less. The laser spots SPOT may have a length of about 20 μm to about 25 μm in the Z-axis direction.

The laser light LR may be applied to the second surface of the mother substrate MSUB and may form a plurality of laser spots SPOT in the 3D space of the mother substrate MSUB. The laser spots SPOT may be spaced apart from one another in the X-, Y-, and Z-axis direction in the 3D space of the mother substrate MSUB. The laser light LR may be applied to the mother substrate MSUB by an optical device such as a diffractive optical element ("DOE") or a spatial laser modulator ("SLM") and may form a plurality of laser spots SPOT at the same time in the 3D space of the mother substrate MSUB.

The laser spots SPOT may have a predetermined trajectory in the 3D space of the mother substrate MSUB. The laser spots SPOT may be a predetermined distance apart from one another in the X-, Y-, and Z-axis directions and may be formed along a predetermined trajectory. During an etching process following the application of the laser light LR, an etchant may penetrate the laser spots SPOT may thus etch the mother substrate MSUB, and the mother substrate MSUB may be cut along the trajectory of the laser spots SPOT. That is, the shape of side surfaces (SS1 and SS2) of a substrate SUB cut out of the mother substrate MSUB may vary depending on the trajectory of the laser spots SPOT. According to the method of FIG. 15, the laser spots SPOT, which are formed in the process of applying the laser light LR to the mother substrate MSUB, may have a curved trajectory in 3D space, and the substrate SUB cut out of the mother substrate MSUB may have curved side surfaces (SS1 and SS2).

The laser light LR may be applied along the Y-axis direction, and the laser spots SPOT may be designed to from a trajectory that meets a particular condition along the X- and Z-axis directions.

Figure 23:
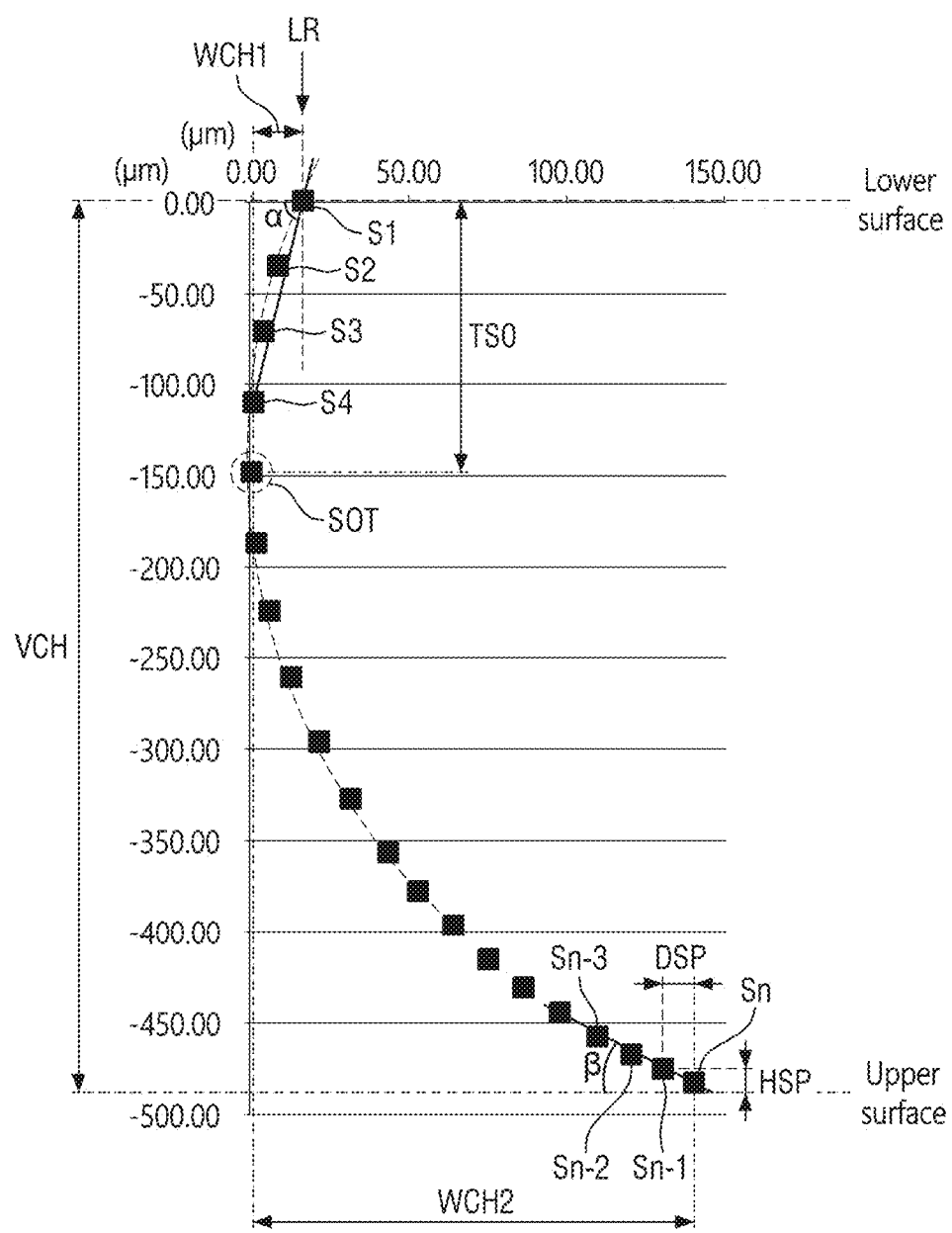
FIG. 23 is a graph showing an embodiment of a laser spot trajectory defined by the method of fabricating a display device according to the disclosure.
Figure 24:
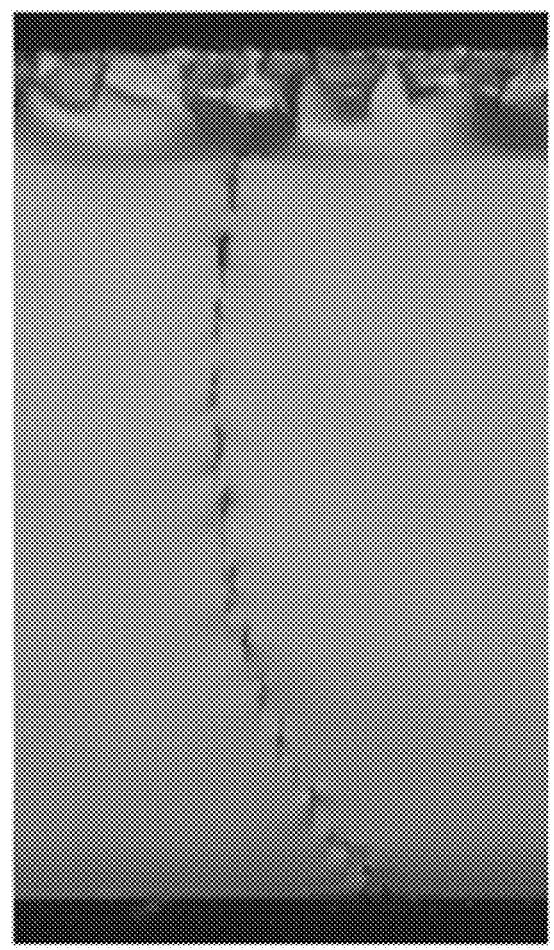
FIG. 24 is a photomicrograph showing laser spots formed on a mother substrate along the laser spot trajectory of FIG. 23.

FIG. 23 is a graph showing an embodiment of a laser spot trajectory defined by the method of fabricating a display device according to the disclosure. FIG. 24 is a photomicrograph showing laser spots formed on a mother substrate along the laser spot trajectory of FIG. 23. FIG. 23 is a graph showing a trajectory, on the X- and Z-axes, defined by a plurality of laser spots SPOT, which are defined by applying laser light LR to a mother substrate MSUB.

Referring to FIGS. 23 and 24, the thickness of the mother substrate MSUB may be about 400 μm to about 600 μm. When the thickness of the mother substrate MSUB is about 500 μm, the laser spots SPOT may be in the range of depths of about 0 μm to about 500 μm in the mother substrate MSUB in the Z-axis direction. That is, the depth (or thickness) of a processing area, which is an area processed with the laser light LR may account for about 95% to about 100% of the thickness of the mother substrate MSUB, in the thickness of the mother substrate MSUB (or in the Z-axis direction). When the thickness of the mother substrate MSUB is about 500 μm, the processing area may be in the range of depths of about 450 μm to about 500 μm in the thickness direction of the mother substrate MSUB (or in the Z-axis direction). In the embodiment of FIG. 23, the processing area ranges up to about 482.25 μm in the thickness direction of the mother substrate MSUB (or the Z-axis direction).

The number of laser spots SPOT formed over the thickness of the mother substrate MSUB may be 10 to 50. Specifically, referring to FIG. 23, the number of laser spots SPOT spaced apart from one another in the Z-axis direction, between the lower surface to the upper surface of the mother substrate MSUB, may be 10 to 50. FIG. 23 illustrates that 20 laser spots SPOT are formed, but the disclosure is not limited thereto. In the case of forming laser spots SPOT while moving a laser in the Y-axis direction, the laser spots SPOT may be spaced apart from one another in the X- and Z-axis direction in a cross-sectional view, taken along the X-axis direction, of the mother substrate MSUB. Here, the number of laser spots SPOT measured from a cross section of the mother substrate MSUB may be 10 to 50.

A first vertical distance DSP, which is the distance, in the X-axis direction, between the laser spots SPOT, may be about 10 μm, and a second vertical distance HSP, which is the distance, in the Z-axis direction, between the laser spots SPOT, may be about 7 μm. In the embodiment of FIG. 23, the first vertical distance DSP may be about 9.8 μm, and the second vertical distance HSP may be about 7.05 μm. However, the disclosure is not limited to the embodiment of FIG. 23.

A trajectory formed, on the X and Z axes, by the laser spots SPOT may have curvature. An outermost curvature laser spot SOT may be closer to the second surface of the mother substrate MSUB than to the middle, in the Z-axis direction, of the processing area, as already mentioned above with regard to the shape of the side surfaces (SS1 and SS2) of the substrate SUB of FIG. 8. That is, the outermost curvature laser spot SOT may be disposed closer to the lower surface of the mother substrate MSUB than to a depth corresponding to ½ of the thickness of the mother substrate MSUB.

An outermost curvature point of the trajectory defined by the laser spots SPOT may be disposed at a depth corresponding to about 30% of the thickness of the mother substrate MSUB, from the second surface of the mother substrate MSUB. When the thickness of the mother substrate MSUB is about 500 µm, the outermost curvature point of the trajectory defined by the laser spots SPOT may be at a position about 150 µm apart from the second surface of the mother substrate MSUB or the lower surface BS of the substrate SUB of the display device 10. In the embodiment of FIG. 23, the outermost curvature point of the trajectory defined by the laser spots SPOT may be at a depth of about 148.8 µm. A radius of the curvature of the trajectory defined by the laser spots SPOT may be about 500 µm.

The laser spots SPOT may be formed in series along a trajectory with curvature, starting from the outermost curvature laser spot SOT. Laser spots SPOT ranging from a first laser spot S1, which is a laser spot SPOT formed first by applying the laser light LR and is closest to the second surface (or the lower surface) of the mother substrate MSUB that is irradiated with the laser light LR, to the outermost curvature laser spot SOT, may be formed on the outside of the center of the curvature of the trajectory defined by the laser spots SPOT. On the contrary, laser spots ranging from the outermost curvature laser spot SOT to an n-th laser spot Sn, which is the last laser spot SPOT defined by applying the laser light LR and is closest to the first surface (or the upper surface) of the mother substrate MSUB that is not irradiated with the laser light LR, may be oriented toward the center of the curvature of the trajectory defined by the laser spots SPOT.

A processing area in the X-axis direction may be defined from the outermost curvature point by the trajectory defined by the laser spots SPOT. In an embodiment, an X-axis processing area WCH and a Z-axis processing area VCH may be defined. A first X-axis processing area WCH1 of an X-axis processing area WCH may have a horizontal distance of about 10 µm to about m, which is the horizontal distance between the outermost curvature laser spot SOT and the first laser spot S1. A second X-axis processing area WCH2 of the X-axis processing area WCH may have a horizontal distance of about 120 µm to about 150 µm, which is the horizontal distance between the outermost curvature laser spot SOT and the n-th laser spot Sn. Here, the term "horizontal distance" may refer to the difference in X coordinate between the first and n-th laser spots S1 and Sn. That is, the term "horizontal distance" may refer to the distance, in the X-axis direction, between imaginary lines passing through the outermost curvature laser spot SOT and the first laser spot S1 in the Z-axis direction or between imaginary lines passing through the outermost curvature laser spot SOT and the n-th laser spot Sn in the Z-axis direction. In the embodiment of FIG. 23, the horizontal distance of the first X-axis processing area WCH1 may be about 16.47 µm, and the horizontal distance of the second X-axis processing area WCH2 may be about 139.61 µm.

As the trajectory defined by the laser spots SPOT has curvature, angles (α and β) may be defined between the trajectory defined by the laser spots SPOT and the first and second surfaces (or the upper and lower surfaces) of the mother substrate MSUB. An incidence angle α defined by an imaginary line connecting the first laser spot S1, a second laser spot S2, a third laser spot S3, and a fourth laser spot S4, which are adjacent to the second surface (or the lower surface) of the mother substrate MSUB, and the second surface (or the lower surface) of the mother substrate MSUB may range from 70° to 90°. An emission angle β defined by an imaginary line connecting an (n−3)-th laser spot Sn−3, an (n−2)-th laser spot Sn−2, an (n−1)-th laser spot Sn−1, and the n-th laser spot Sn, which are adjacent to the first surface (or the upper surface) of the mother substrate MSUB, and the first surface (or the upper surface) of the mother substrate MSUB may range from 35° to 40°. In the embodiment of FIG. 23, the incidence angle α may be 81.85°, and the emission angle β may be 39.62°.

As already mentioned above, the trajectory defined by the laser spots SPOT, which are defined by applying the laser light LR to the mother substrate MSUB, may have a curved shape, and the distance between the laser spots SPOT and processing areas may be designed such that the side surfaces (SS1 and SS2) of the substrate SUB of the display device 10, which is cut out of the mother substrate MSUB, may also have a curved shape. The shape of the side surfaces (SS1 and SS2) of the substrate SUB of the display device 10 may be determined by the position of the outermost curvature laser spot SOT, the incidence angle α, the emission angle β, and the size of processing areas in the trajectory defined by the laser spots SPOT. The trajectory defined by the laser spots SPOT may vary. According to the method of FIG. 15, the side surfaces (SS1 and SS2) of the substrate SUB of the display device 10 may be curved by applying the laser light LR such that the laser spots SPOT form a trajectory with curvature, and the substrate SUB of the display device 10 may have resistance to external shock.

The unilateral tolerance of the laser light LR may be about 50 µm, and the bilateral tolerance of the laser light LR may be about 100 µm. The unilateral tolerance of the laser light LR may be cutting error in one direction (e.g., in the X-axis direction) when the cutting lines LS are sketched by forming the laser spots SPOT with the laser light LR.

The distance from the encapsulation layer ENC to the edge EG of the display panel 100 may be affected by a unilateral tolerance SE2 of the laser light LR. The distance between the encapsulation layer ENC and the laser spots SPOT when the laser light LR is properly applied to each designated position, may be defined as DCH.

In a case where the laser light LR is applied to the left by as much as a maximum unilateral tolerance of the laser light LR, the distance between the encapsulation layer ENC and the laser spots SPOT may be DCH−SE2. On the contrary, in a case where the laser light LR is applied to the right by as much as the maximum unilateral tolerance of the laser light LR, the distance between the encapsulation layer ENC and the laser spots SPOT may be DCH+SE2.

As the substrate SUB of the display device 10 is separated from the mother substrate MSUB along the laser spots in an etching process subsequent to the application of the laser light LR, the distance between the encapsulation layer ENC and the laser spots SPOT may be similar to the minimum distance between the encapsulation layer ENC and the edge EG of the display panel 100, as illustrated in FIG. 8. The distance between the encapsulation layer ENC and the laser spots SPOT may be slightly reduced in the etching process and may become the minimum distance between the encapsulation layer ENC and the edge EG of the display panel 100. The minimum distance between the encapsulation layer ENC and the edge EG of the display panel 100 may vary by as much as twice the unilateral tolerance of the laser light LR (or as much as the bilateral tolerance of the laser light LR), e.g., about 100 µm.

Referring to FIG. 8, the distance between the encapsulation layer ENC and the edge EG of the display panel 100 may be DCH−SE2 or DCH+SE2. In an embodiment, when the distance DCH between the encapsulation layer ENC and the laser spots SPOT is about 50 µm and the unilateral tolerance of the laser light LR is about 50 µm, the distance between the encapsulation layer ENC and the edge EG of the display panel 100 may be about 300 μm or less, but may vary by as much as about 100 μm depending on the unilateral tolerance of the laser light LR, for example. The distance to the edge EG of the display panel 100 may be a minimum of about 0 μm or a maximum of about 300 μm.

The unilateral tolerance of the laser light LR, which is about 50 μm, may be less than the unilateral tolerance of a cutting member when cutting the substrate SUB of the display device 10 with the cutting member. That is, as the unilateral tolerance of the laser light LR is less than the unilateral tolerance of a cutting member, the distance between the encapsulation layer ENC and the edge EG of the display panel 100 may be reduced, as compared to the case of cutting the substrate SUB of the display device 10 with the cutting member.

Thereafter, referring to FIGS. 18 and 25 through 29, a second protective film PRF2 is attached on the first protective films PRF1, and the mother substrate MSUB is etched by spraying an etchant onto the second surface of the mother substrate MSUB without using a mask.

The second protective film PRF2 may be attached on the first protective films PRF1 and parts of the mother substrate MSUB not covered, but exposed by the first protective films PRF1. The second protective film PRF2 may cover regions where the laser spots SPOT are formed. The second protective film PRF2 may be an acid-resistant film for protecting the display cells DPC from the etchant for etching the mother substrate MSUB.

The mother substrate MSUB may be etched by spraying an etchant onto the second surface of the mother substrate MSUB without using a mask. As a result, the thickness of the mother substrate MSUB may be reduced, and the mother substrate MSUB may be cut along the laser spots SPOT. That is, the display cells DPC may be separated from the mother substrate MSUB.

In the case of spraying the etchant onto the second surface of the mother substrate MSUB, the thickness of the mother substrate MSUB may be reduced from a first thickness T1' to a second thickness T2'. As the mother substrate MSUB is etched without using a mask, all regions (even the regions where the laser spots SPOT are formed) on the second surface of the mother substrate MSUB may be uniformly etched isotropically.

As the etchant penetrates the laser spots SPOT, which are defined by the laser light, when the thickness of the mother substrate MSUB is being reduced by the etchant, differences in etching rate may arise between the regions where the laser spots SPOT are formed and regions where the laser spots SPOT are not formed.

As the laser spots SPOT are formed in regions irradiated with the laser light LR, the surface area of the mother substrate MSUB may increase in the regions irradiated with the laser light LR than in regions not irradiated with the laser light LR. As the regions irradiated with the laser light LR have a greater surface area than that of the regions not irradiated with the laser light LR, the regions irradiated with the laser light LR may have a higher etching rate than that of the regions not irradiated with the laser light LR because of their relatively substantially large contact areas with the etchant. Also, the physical properties of the mother substrate MSUB may change in the regions irradiated with the laser light LR. The mother substrate MSUB may have a higher reactivity to the etchant and a higher etching rate in the regions irradiated with the laser light LR than in the regions not irradiated with the laser light LR.

Accordingly, anisotropic etching may be performed the mother substrate MSUB in which etching rate may be higher in the regions where the laser spots SPOT are formed than in the regions where the laser spots SPOT are not formed. As a result, the side surfaces (SS1 and SS2) of the substrate SUB of the display device 10, which is separated from the mother substrate MSUB, may have a curved shape similar to the trajectory defined by the laser spots SPOT and may be etched more than the regions where the laser spots SPOT are not formed. The curvature of the trajectory defined by the laser spots SPOT may differ from the curvature of the side surfaces (SS1 and SS2) of the substrate SUB of the display device 10 because of differences in etching rate during the etching of the mother substrate MSUB along the laser spots SPOT.

Also, the etching process may be performed on the second surface (or the lower surface) of the mother substrate MSUB, to which the laser light LR is applied. Accordingly, differences in etching rate may arise not only between the regions where the laser spots SPOT are formed and the regions where the laser spots SPOT are not formed, but also between the first surface (or the upper surface) and the second surface (or the lower surface) of the mother substrate MSUB. The etching rate may be higher on the second surface than on the first surface of the mother substrate MSUB, and the mother substrate MSUB may be etched more along the laser spots SPOT than in other regions. That is, differences in curvature and the size of glass pores on the surfaces of the substrate SUB of the display device 10, which is cut out of the mother substrate MSUB, may arise due to the difference in etching rate between first and second side surfaces SS1 and SS2 of the substrate SUB of the display device 10, which are adjacent to the upper and lower surfaces US and BS, respectively, of the mother substrate MSUB. In an embodiment, as the etchant penetrates the mother substrate MSUB, from the second surface of the mother substrate MSUB, the second side surface SS2, which is adjacent to the second surface of the mother substrate MSUB or the lower surface BS of the substrate SUB of the display device 10, may have a gentler curvature than that of the first side surface SS1, which is adjacent to the first surface of the mother substrate MSUB or the upper surface US of the substrate SUB of the display device 10, for example. Also, the size of glass pores formed on the second side surface SS2 may be less than the size of glass pores formed on the first side surface SS1.

As the first surface of the mother substrate MSUB is penetrated by the etchant due to the second protective film PRF2, but the second surface of the mother substrate MSUB is etched by the etchant, differences in roughness, strength, light transmittance, light reflectance, local density, and surface chemical structure may arise between the first and second surfaces of the mother substrate MSUB. In an embodiment, dimples may be formed in the mother substrate MSUB by the etchant, for example.

Once the etching process is complete, the second protective film PRF2 may be detached.

Figure 20:
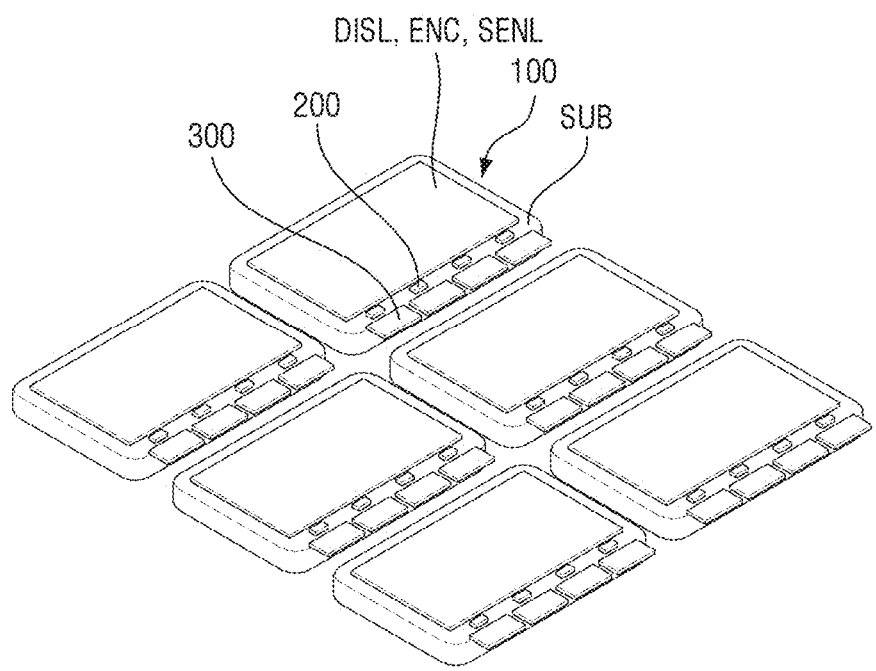

Thereafter, referring to FIG. 20, driver ICs 200 and circuit boards 300 may be attached to each of the display cells DPC, the first protective films PRF1 may be detached from the display cells DPC, and polarizer films PF and cover windows CW are attached to the display cells DPC, thereby obtaining the display device 10.

According to the method of FIG. 15, as the mother substrate MSUB is cut via etching, the distance between the display cell DPC and the display panel 100 of the display device 10 may be minimized, as compared to the case of cutting the mother substrate MSUB with a cutting member. That is, the size of any unnecessary space on the outermost side of the display panel 100 of the display device 10 may be minimized. Also, as the thickness of the mother substrate MSUB may be reduced via etching and the substrate SUB of the display device 10 may be separated from the mother substrate MSUB, the manufacturing efficiency of the display device 10 may be improved.

The fabrication of the display device 10 may include forming a plurality of laser spots SPOT, which are arranged in 3D space in the X-, Y-, and Z-axis directions by applying laser light LR, and performing an etching process. During the etching process, the mother substrate MSUB may be etched along the laser spots SPOT, and the side surfaces (SS1 and SS2) of the substrate SUB of the display device 10, which is cut out of the mother substrate MSUB, may have a curved shape. Accordingly, the substrate SUB of the display device 10 may have resistance to external shock.

Display devices according to other embodiments of the disclosure will hereinafter be described.

Figure 28:
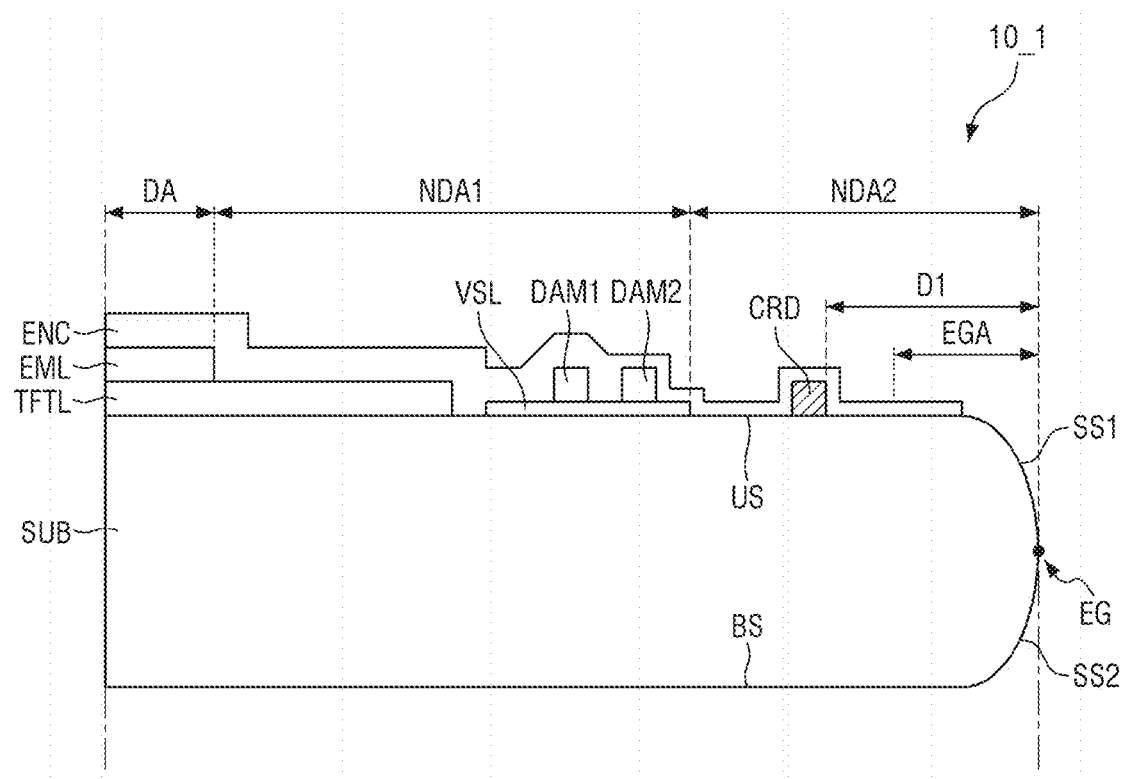
FIG. 28 is a cross-sectional view of another embodiment of a display panel according to the disclosure.
Figure 29:
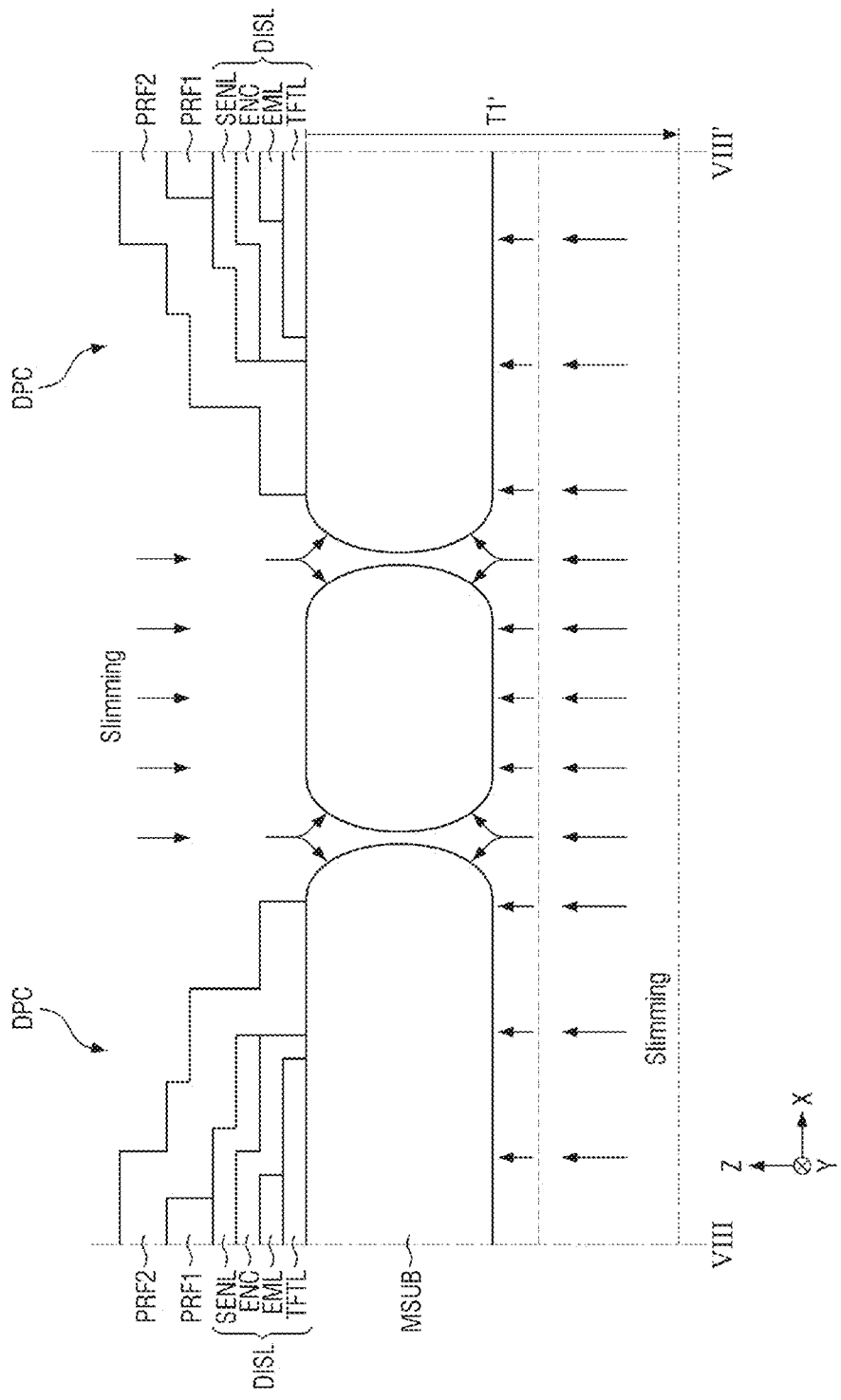
FIG. 29 is a cross-sectional view illustrating an embodiment of an etching process as performed during the fabrication of a display device of FIG. 28.

FIG. 28 is a cross-sectional view of an embodiment of a display panel according to the disclosure. FIG. 29 is a cross-sectional view illustrating an embodiment of an etching process as performed during the fabrication of a display device in the embodiment of FIG. 28.

Referring to a display device 10_1 of FIGS. 28 and 29, an edge EG may be disposed at a depth corresponding to ½ of the thickness of a substrate SUB, and first and second side surfaces SS1 and SS2 of the substrate SUB may have the same curvature and the same length. The first and second side surfaces SS1 and SS2 may be symmetrical with respect to the edge EG.

Accordingly, the first and second side surfaces SS1 and SS2 may have a uniform curvature, and the resistance of the display device 10_1 to external shock may be further improved.

An etching process for etching a mother substrate MSUB may be performed on both first and second surfaces of the mother substrate MSUB at the same time. During the etching process, a second protective film PRF2 may expose a part of the first surface (or the upper surface) of the mother substrate MSUB. The etching process may be performed on both the second surface (or the lower surface) of the mother substrate MSUB where the second protective film PRF2 is not disposed and the part of the upper surface of the mother substrate MSUB, exposed by the second protective film PRF2, at the same time. The mother substrate MSUB may be etched along a trajectory defined by laser spots SPOT, and as the etching process is performed on both the upper and lower surfaces of the mother substrate MSUB at the same time, the etching rate for the mother substrate MSUB may be further increased. As a result, the amount of time that it takes to fabricate the display device 10_1 may be reduced, and the first and second side surfaces SS1 and SS2 may become smoother depending on the conditions of the etching process.

Figure 30:
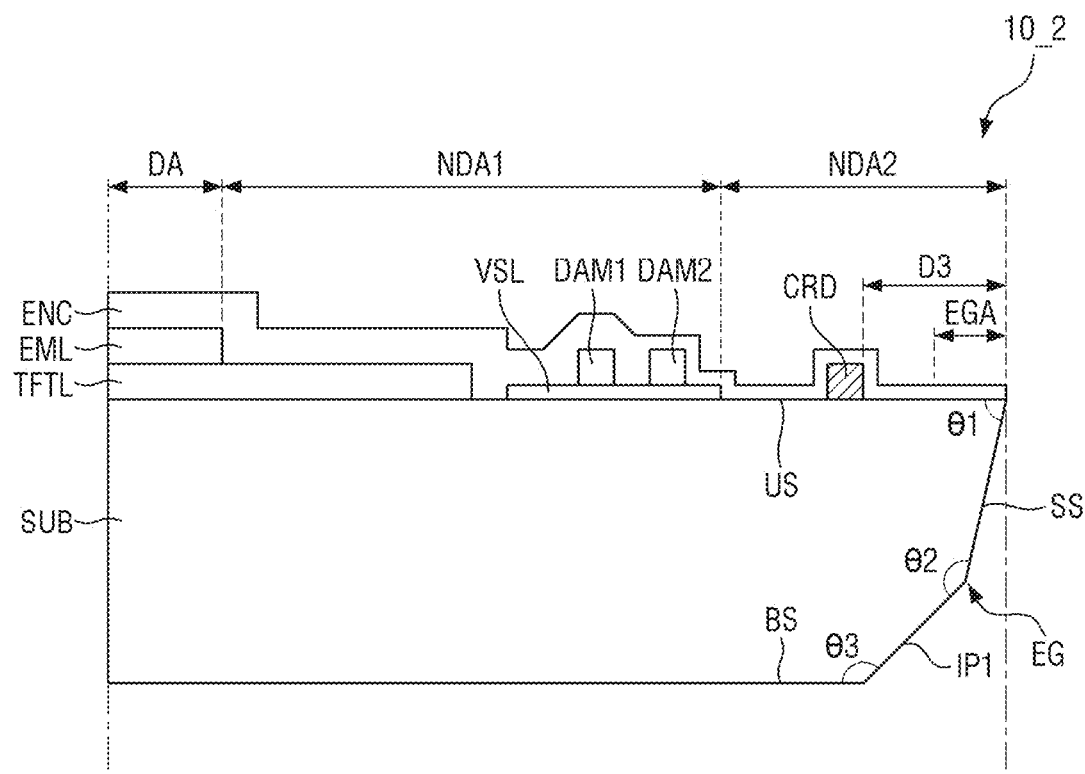
FIG. 30 is a cross-sectional view of another embodiment of a display panel according to the disclosure.
Figure 31:
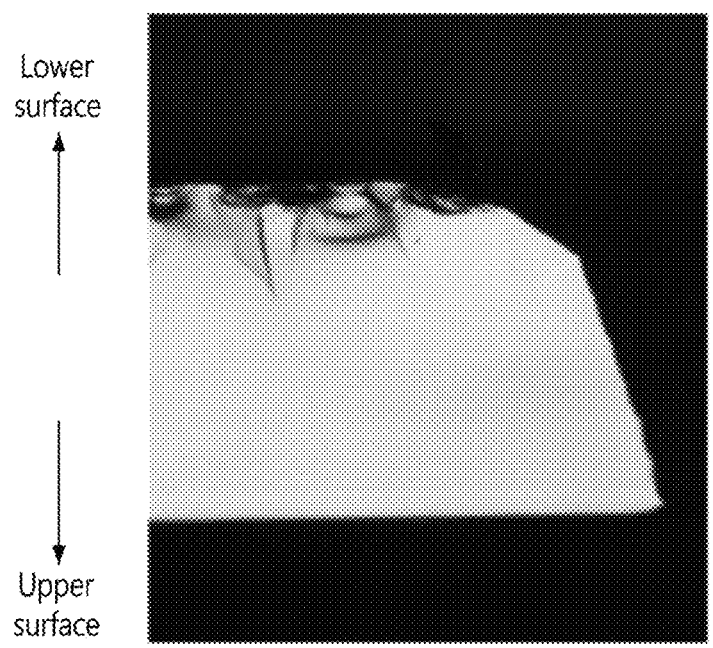
FIG. 31 is a photomicrograph showing an edge portion of a substrate of the display panel of FIG. 30.

FIG. 30 is a cross-sectional view of another embodiment of a display panel according to the disclosure. FIG. 31 is a photomicrograph showing an edge portion of a substrate of the display panel of FIG. 30.

Referring to a display device 10_2 of FIGS. 30 and 31, a substrate SUB of a display panel 100 may include a side surface SS and a first inclined surface IP1. The side surface SS and the first inclined surface IP1 may not be parallel or orthogonal to, but inclined with respect to, upper and lower surfaces US and BS. The side surface SS and the first inclined surface IP1 may overlap with an edge area EGA where processing traces are left, in a thickness direction (or a Z-axis direction). In an embodiment, a distance D3 between the crack dam CRD and the edge EG may be similar to a distance D1 of 10_1 shown in FIG. 28.

An angle θ1 between the side surface SS and the upper surface US may be about 80°. An angle θ2 between the side surface SS and the first inclined surface IP1 and an angle θ3 between the first inclined surface IP1 and the lower surface BS may be obtuse angles.

During the fabrication of the display device 10_2, which has the side surface SS and the first inclined surface IP1, an inclined trajectory may be defined by laser spots SPOT. The trajectory defined by the laser spots SPOT may not necessarily have a curved shape and may be designed such that the substrate SUB, which is cut along the laser spots SPOT, may have substantially high shock resistance. Accordingly, the shape of side surfaces of the substrate SUB of the display device 10_2 may be modified in various manners.

Figure 32:
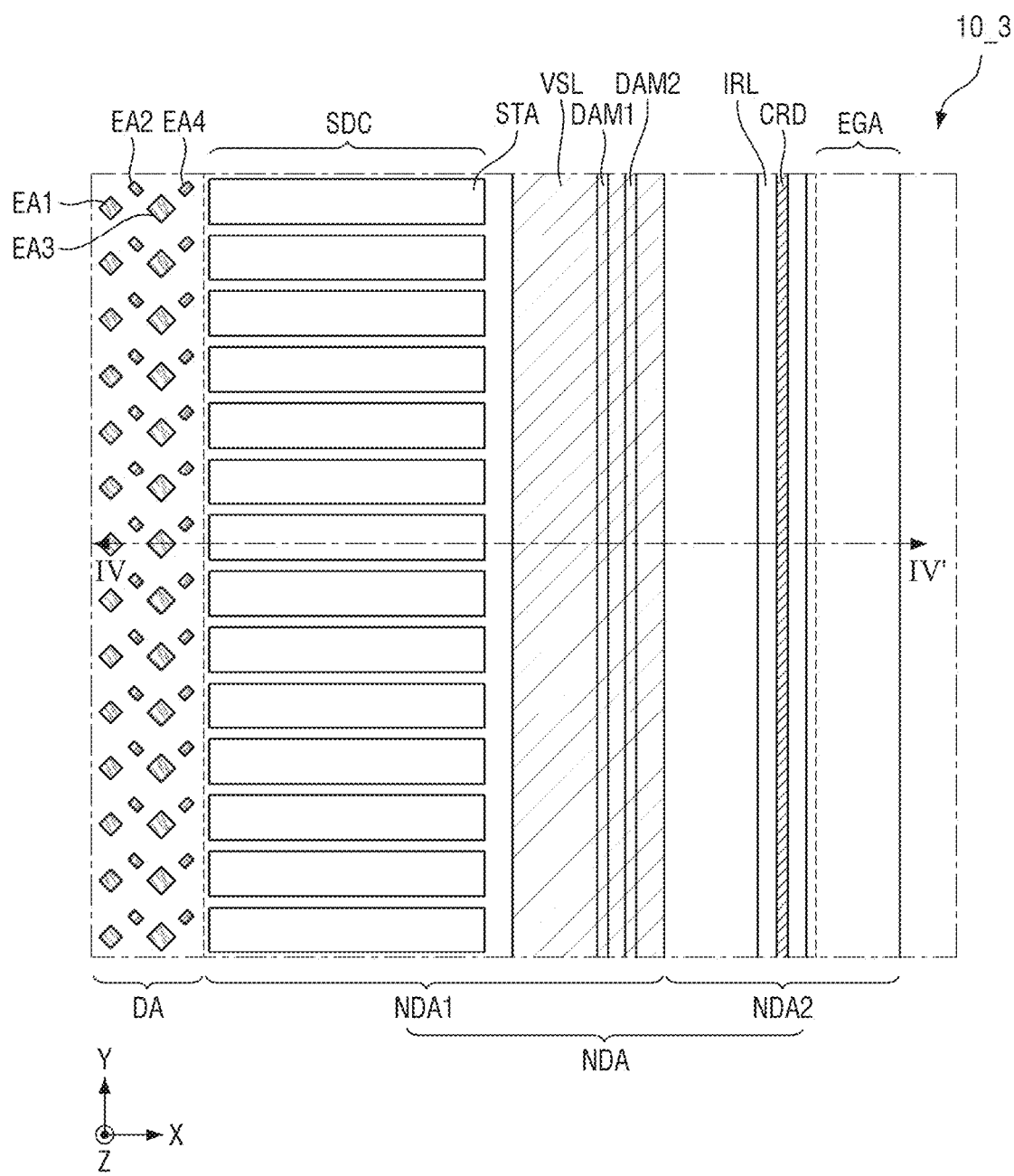
FIG. 32 is a plan view illustrating another embodiment of a non-display area of a display panel according to the disclosure.
Figure 33:
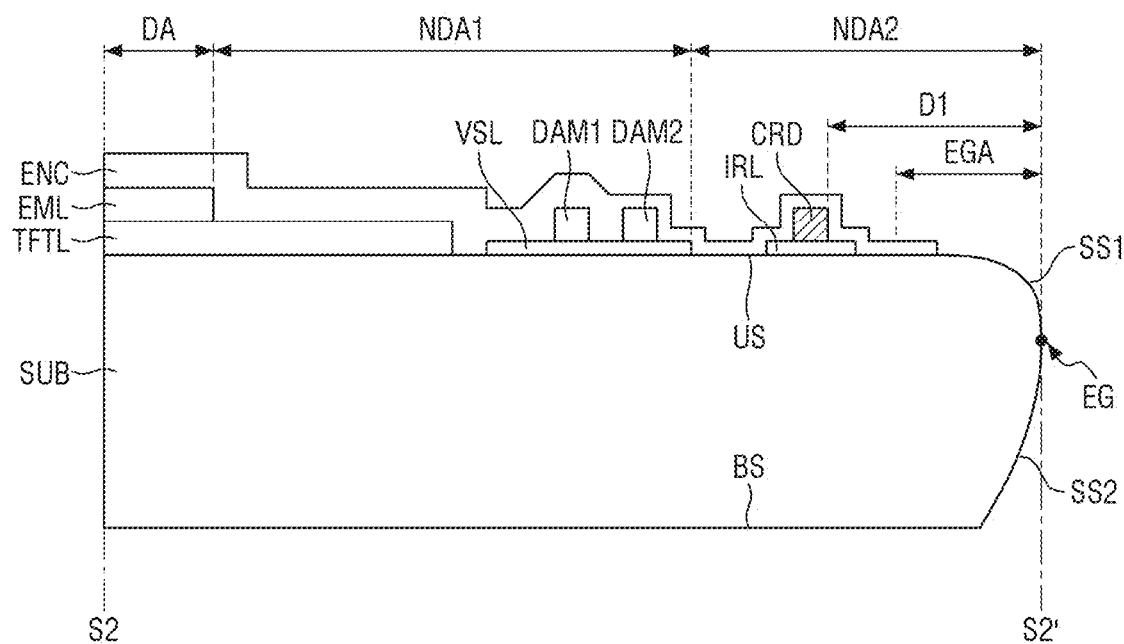
FIG. 33 is a cross-sectional view taken along line IV-IV' of FIG. 32.

FIG. 32 is a plan view illustrating another embodiment of a non-display area of a display panel according to the disclosure. FIG. 33 is a cross-sectional view taken along line IV-IV' of FIG. 32.

Referring to FIGS. 32 and 33, a display device 103 may further include a heat dissipation layer IRL, which overlaps with a crack dam CRD. The heat dissipation layer IRL may be disposed in an outer part of a display panel 100, on the inside of an edge area EGA, and may overlap with the crack dam CRD.

The heat dissipation layer IRL may dissipate heat generated by laser light applied during the cutting of a mother substrate MSUB or may minimize the influence of the laser light on the display panel 100 during the cutting of the mother substrate MSUB by increasing the rate of absorption of infrared light. In an embodiment, the heat dissipation layer IRL may include a metal material with a substantially high thermal conductivity or a material with a substantially high infrared absorption rate, for example. The heat dissipation layer IRL may be formed as a single layer or a multilayer including one of Mo, Al, Cr, Au, Ti, Ni, Nd, Cu, and any alloys thereof.

The width of the heat dissipation layer IRL may be greater than the width of the edge area EGA. In an embodiment, the width of the heat dissipation layer IRL may be about 50 μm to about 300 μm, for example, but the disclosure is not limited thereto.

Figure 34:
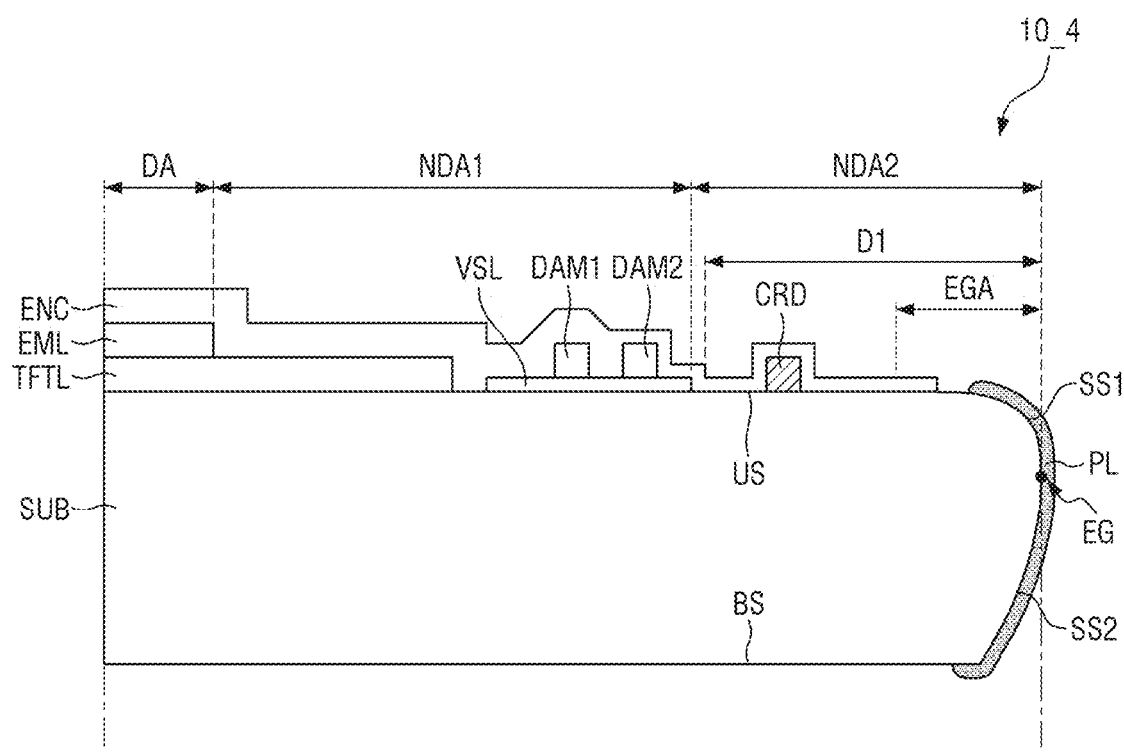
FIG. 34 is a cross-sectional view of another embodiment of a display panel according to the disclosure.

FIG. 34 is a cross-sectional view of another embodiment of a display panel according to the disclosure.

Referring to FIG. 34, a display device 10_4 may further include a passivation layer PL, which is disposed on an edge EG of a display panel 100. The passivation layer PL may cover first and second side surfaces SS1 and SS2 of a substrate SUB and a part of a lower surface BS of the substrate SUB. The passivation layer PL may overlap with an edge area EGA and may partially cover processing traces on the upper surface US of the substrate SUB.

During the fabrication of the display device 10_4, a process of separating the substrate SUB from a mother substrate MSUB via laser irradiation and etching may be performed. As a result, the edge area EGA where the processing traces are left may be formed on the substrate SUB of the display panel 100, and the first and second side surfaces SS1 and SS2 may be inclined or curved. This type of display panel 100 may be relatively susceptible to external shock. Thus, for protection, the display device 104 may further include the passivation layer PL, which is disposed on the substrate SUB.

The passivation layer PL may be disposed on cut surfaces of the substrate SUB that are defined by laser irradiation and etching during the separation of the substrate SUB from the mother substrate MSUB, as performed during the fabrication of the display device 10_4. The passivation layer PL is illustrated as covering the first and second side surfaces SS1 and SS2 and a part of the upper surface US, but the disclosure is not limited thereto. In an alternative embodiment, in some embodiments, the passivation layer PL may cover a side surface SS and a first inclined surface IP1 (of FIG. 30) of the substrate SUB, and another passivation layer PL may be further disposed on a lower surface BS of the substrate SUB.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
   a glass substrate including:
      a first surface;
      a second surface which is opposite to the first surface; and
      a side surface which is disposed between the first and second surfaces;
   an outermost structure disposed on the first surface of the glass substrate and adjacent to an edge of the glass substrate; and
   a display area including a plurality of emission areas, which are spaced apart from the edge, on the first surface of the glass substrate,
   wherein
   the side surface has a curved shape with the edge protruding to an outermost side of the glass substrate,
   the side surface includes a first side surface, which is disposed between the edge and the first surface, and a second side surface, which is between the edge and the second surface and has a different curvature from the first side surface,
   the glass substrate includes an edge area, which is on the first surface, adjacent to the edge, and, in which processing traces are left,
   a vertical distance between the edge and the second surface is greater than a vertical distance between the edge and the first surface in a thickness direction, and
   a diameter of glass pores defined in the first side surface is less than a diameter of glass pores defined in the second side surface.

2. The display device of claim 1, wherein the second side surface has a radius of a curvature of about 200 micrometers to about 300 micrometers.

3. The display device of claim 1, wherein
   a length of the first side surface is less than a length of the second side surface, and
   the second side surface has a curvature gentler than a curvature of the first side surface.

4. The display device of claim 1, wherein a width by which the second side surface protrudes from an end of the second side surface to the edge is about 10% to about 20% of an overall thickness of the glass substrate.

5. The display device of claim 4, wherein the width by which the second side surface protrudes from the end of the second side surface to the edge is about 20 micrometers to about 40 micrometers.

6. The display device of claim 1, wherein
   the diameter of the glass pores defined in the first side surface is 5 micrometers to 30 micrometers, and
   the diameter of the glass pores defined in the second side surface is 30 micrometers to 50 micrometers.

7. The display device of claim 1, wherein a minimum distance between the edge of the glass substrate and the outermost structure is about 130 micrometers or less.

8. The display device of claim 1, wherein a width of the edge area is about 50 micrometers or less.

9. The display device of claim 1, further comprising:
   an encapsulation layer covering the display area and the outermost structure,
   wherein
   the encapsulation layer includes a first encapsulation inorganic film, an encapsulation organic film, which is disposed on the first encapsulation inorganic film, and a second encapsulation inorganic film, which is disposed on the encapsulation organic film, and
   the first and second encapsulation inorganic films cover the outermost structure.

10. A display device comprising:
    a glass substrate including:
       a first surface;
       a second surface which is opposite to the first surface; and
       a side surface which is disposed between the first and second surfaces;
    an outermost structure disposed on the first surface of the glass substrate and adjacent to an edge of the glass substrate; and
    a display area including a plurality of emission areas, which are spaced apart from the edge, on the first surface of the glass substrate,
    wherein
    the side surface has a curved shape with the edge protruding to an outermost side of the glass substrate,
    the side surface includes a first side surface, which is disposed between the edge and the first surface, and a second side surface, which is between the edge and the second surface and has a different curvature from the first side surface,
    the glass substrate includes an edge area, which is on the first surface, adjacent to the edge, and, in which processing traces are left,
    a vertical distance between the edge and the second surface is greater than a vertical distance between the edge and the first surface in a thickness direction, and
    the vertical distance between the second surface and an imaginary plane which is parallel to the second surface and on which the edge is disposed is greater than 50% and equal to or less than about 60% of an overall thickness of the glass substrate.

11. The display device of claim 10, wherein the vertical distance is about 100 micrometers to about 120 micrometers.

12. An electronic deice comprising:
    a display device comprising:
       a glass substrate including:
          a first surface;
          a second surface which is opposite to the first surface; and
          a side surface which is disposed between the first and second surfaces;
       an outermost structure disposed on the first surface of the glass substrate and adjacent to an edge of the glass substrate; and
       a display area including a plurality of emission areas, which are spaced apart from the edge, on the first surface of the glass substrate, wherein
the side surface has a curved shape with the edge protruding to an outermost side of the glass substrate,
the side surface includes a first side surface, which is disposed between the edge and the first surface, and a second side surface, which is between the edge and the second surface and has a different curvature from the first side surface,
the glass substrate includes an edge area, which is on the first surface, adjacent to the edge, and, in which processing traces are left,
a vertical distance between the edge and the second surface is greater than a vertical distance between the edge and the first surface in a thickness direction, and
a diameter of glass pores defined in the first side surface is less than a diameter of glass pores defined in the second side surface.

13. The electronic device of claim 12, wherein the second side surface has a radius of a curvature of about 200 micrometers to about 300 micrometers.

14. The electronic device of claim 12, wherein
a length of the first side surface is less than a length of the second side surface, and
the second side surface has a curvature gentler than a curvature of the first side surface.

15. The electronic device of claim 12, wherein a width by which the second side surface protrudes from an end of the second side surface to the edge is about 10% to about 20% of an overall thickness of the glass substrate.

16. The electronic device of claim 15, wherein the width by which the second side surface protrudes from the end of the second side surface to the edge is about 20 micrometers to about 40 micrometers.

17. The electronic device of claim 12, wherein
the diameter of the glass pores defined in the first side surface is 5 micrometers to 30 micrometers, and
the diameter of the glass pores defined in the second side surface is 30 micrometers to 50 micrometers.

18. The electronic device of claim 12, wherein the vertical distance between the second surface and an imaginary plane which is parallel to the second surface and on which the edge is disposed is greater than 50% and equal to or less than about 60% of an overall thickness of the glass substrate.

19. The electronic device of claim 12, wherein the vertical distance is about 100 micrometers to about 120 micrometers.

20. The electronic device of claim 12, wherein a minimum distance between the edge of the glass substrate and the outermost structure is about 130 micrometers or less.

21. The electronic device of claim 12, wherein a width of the edge area is about 50 micrometers or less.

22. The electronic device of claim 12, wherein the display device is used as a mobile phone, a smartphone, a tablet, a personal computer, a smartwatch, a watchphone, a mobile communication terminal, an electronic notepad, an electronic book, a portable multimedia player, a navigation device, an ultramobile PC, a television, a notebook computer, a monitor, a billboard, or an Internet-of-Things device.

* * * * *